US006809533B1

United States Patent
Anlage et al.

(10) Patent No.: US 6,809,533 B1
(45) Date of Patent: Oct. 26, 2004

(54) QUANTITATIVE IMAGING OF DIELECTRIC PERMITTIVITY AND TUNABILITY

(75) Inventors: Steven Mark Anlage, Laurel, MD (US); David E. Steinhauer, Brier, WA (US); Constantine P. Vlahacos, Baltimore, MD (US); Frederick C. Wellstood, Lanham, MD (US)

(73) Assignee: University of Maryland, College Park, Riverdale, MD (US)

( * ) Notice: Subject to any disclaimer, the term of this patent is extended or adjusted under 35 U.S.C. 154(b) by 0 days.

(21) Appl. No.: 10/069,996
(22) PCT Filed: Apr. 5, 2000
(86) PCT No.: PCT/US00/08943
  § 371 (c)(1),
  (2), (4) Date: Mar. 1, 2002
(87) PCT Pub. No.: WO01/20352
  PCT Pub. Date: Mar. 22, 2001

Related U.S. Application Data
(60) Provisional application No. 60/191,903, filed on Mar. 24, 2000, and provisional application No. 60/153,354, filed on Sep. 10, 1999.

(51) Int. Cl.$^7$ .............................................. G01R 31/302
(52) U.S. Cl. ....................................................... 324/750
(58) Field of Search ................................. 324/750, 751, 324/752, 753, 765, 158.1; 250/201.3, 306, 307

(56) References Cited

U.S. PATENT DOCUMENTS

| 5,900,618 A | * | 5/1999 | Anlage et al. ............ 250/201.3 |
| 6,005,246 A | * | 12/1999 | Kitamura et al. ............ 250/306 |
| 6,173,604 B1 | * | 1/2001 | Xiang et al. ................... 73/105 |

* cited by examiner

*Primary Examiner*—David A. Zarneke
*Assistant Examiner*—Tung X. Nguyen
(74) *Attorney, Agent, or Firm*—Rosenberg, Klein & Lee

(57) ABSTRACT

A near-field scanning microwave microscope images the permittivity and dielectric tunability of bulk and thin film dielectric samples on a length scale of about 1 micron or less. The microscope is sensitive to the linear permittivity, as well as to non-linear dielectric terms, which can be measured as a function of an applied electric field. A versatile finite element model is used for the system, which allows quantitive results to e obtained. The technique is non-destructive and has broadband (0.1–50 GHz) capability.

23 Claims, 19 Drawing Sheets

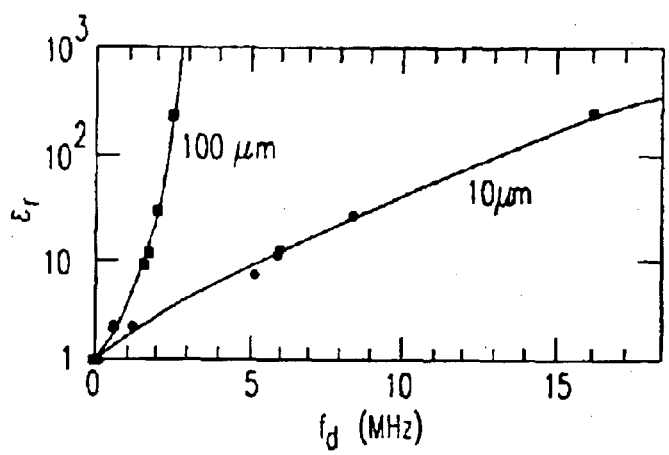
FIG. 19
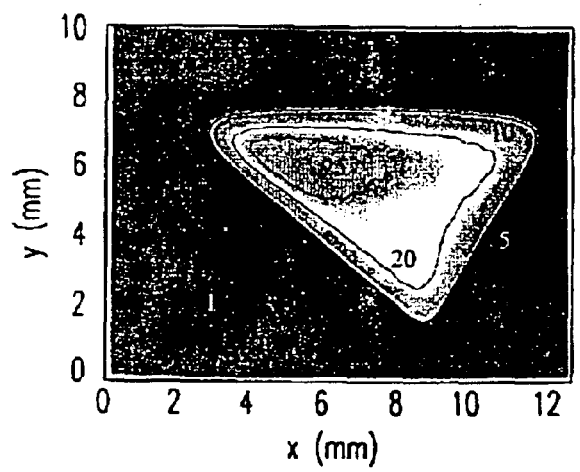
FIG. 20
| MATERIAL | EXPERIMENTAL VALUE | LITERATURE VALUE | FREQUENCY (GHz) | REFERENCES |
|---|---|---|---|---|
| SILICON | 12 | 11.7 | 100 | 11 |
| GLASS | 12 | 6.7 | $10^{-3}$ | 12 |
| SrTiO$_3$ | 180 | 230 | 0.1 | 9 |
| LaAlO$_3$ | 20 | 23.9 | 18 | 10 |
| SAPPHIRE (CERAMIC) | 20 | 10.0 | 100 | 11 |
| TEFLON | 2.1 | 2.1 | 10 | 9 |
FIG. 21

QUANTITATIVE IMAGING OF DIELECTRIC PERMITTIVITY AND TUNABILITY

This application claims the benefit of provisional applications Nos. 60/153,354 filed Sep. 10, 1999 and 60/191,903 filed Mar. 24, 2000. +gi This invention was made with government support under Contract Numbers ECS 9632811, DMR 9632521 and DMR 96240231 awarded by the National Science Foundation. The U.S. Government has certain rights in this invention.

BACKGROUND OF THE INVENTION

1. Field of the Invention

The present invention relates generally to imaging, and more particularly to measuring dielectric properties using a near-filed scanning microwave microscope.

2. Related Art

Dielectric thin film research has become increasingly important as the demand grows for smaller, faster, and more reliable electronics. For example, high permittivity thin films are under study in order to fabricate smaller capacitors while minimizing leakage. Low permittivity materials are being sought to allow smaller scale circuits while minimizing undesirable stray capacitance between wires. Nonlinear dielectrics, which have a dielectric permittivity which is a function of electric field, are being used in tunable devices, particularly at microwave frequencies. Finally, ferroelectric thin films are a solution for large-scale, non-volatile memories.

All of these dielectric thin film technologies demand high-quality, homogeneous films. However, this goal is often difficult to achieve because of the complicated fabrication process involved. Consequently, it is important to have a set of reliable techniques for evaluating thin film properties, such as permittivity and tunability. A number of different techniques are available. One standard low-frequency ($\leq 1$ MHz) method uses thin film capacitors to measure the normal and in-plane components of the permittivity tensor. Another uses reflection measurements from a Corbino probe. Still another method provides microwave measurements of permittivity by using transmission measurements through a microstrip structure. However, these techniques average over large areas and involve depositing thin film electrodes which itself can alter the properties of the sample. Dielectric resonators have been used as well, but also have the problem of low spatial resolution. More recently, near-field microscopy techniques have allowed quantitative measurements with spatial resolutions much less than the wavelength. These techniques use a resonator which is coupled to a localized region of the sample through a small probe and have the advantage of being non-destructive. However, it is still difficult to arrive at quantitative results and maintain high spatial resolution.

Therefore, what is needed is a non-destructive, non-invasive, system and method for imaging quantitative permittivity and tunability at high spatial resolution.

SUMMARY OF THE INVENTION

The present invention meets the above-mentioned needs by providing a system, apparatus, and method for quantitatively imaging the dielectric properties of bulk and thin film dielectric samples. Permittivity and dielectric tunability are two examples of dielectric properties capable of measurement by the present invention.

The system uses a near-field scanning microwave microscope (NSMM). The NSMM is comprised of a coaxial transmission line resonator having one end coupled to a microwave signal source and the other end terminating with an open-ended coaxial probe. The probe, which has a sharp-tipped center conductor extending beyond the outer conductor, is held fixed while the sample is raster scanned beneath the probe tip. A spring-loaded cantilever sample holder gently presses the sample against the probe tip with a force of about 50 $\mu$N (microNewtons). A feedback circuit keeps the microwave signal source locked onto a selected resonant frequency of the microscope resonator. Because the electric fields generated by the microwave signal are concentrated at the probe tip, the resonant frequency and quality factor of the resonator are a function of the sample properties near the probe tip. Once the microwave signal has been applied to the sample through the probe tip, it is reflected back through the system. The feedback circuit is then able to receive the reflected microwave signal from the coaxial transmission line resonator and calculate a resonant frequency shift. The resonant frequency shift value is then stored in a computer. The computer also controls the scanning of the sample beneath the probe. To obtain quantitative results, the system uses calibration curves to exhibit the relationship between the calculated resonant frequency shift data values and the dielectric properties of a sample.

The invention described herein has the advantage of being able to provide quantitative results for samples on a length scale of about 1 $\mu$m or less. This allows for the measuring of sample sizes relative to the actual environment in which they will be used.

The invention also has the advantage of providing more accurate quantitative results because the sharp protruding center conductor is represented as a cone during modeling.

BRIEF DESCRIPTION OF THE FIGURES

The features and advantages of the present invention will become more apparent from the detailed description set forth below and the following figures in which like reference numbers indicate identical or functionally similar elements. Additionally, the left-most digit of a reference number identifies the drawing in which the reference number first appears.

FIG. 19 is a diagram representative of calibration curves generated for frequency shift measurements taken at heights of 100 $\mu$m and 10 $\mu$m according to an embodiment of the present invention.

FIG. 20 illustrates the dielectric constant of a $LaAlO_3$ sample imaged at 100 $\mu$m and 9.08 GHz using a 480 $\mu$m diameter probe according to an embodiment of the present invention.

FIG. 21 is a chart displaying dielectric constant values taken from literature and the dielectric constant values obtained from experimental measurements taken according to a method of the present invention.

DETAILED DESCRIPTION OF THE PREFERRED EMBODIMENTS

The invention described herein is a system, apparatus, and method for displaying the dielectric properties of bulk and thin film samples. The invention uses a near-field scanning microwave microscope (NSMM).

Physical Design for the System of the Present Invention

Figure 1:
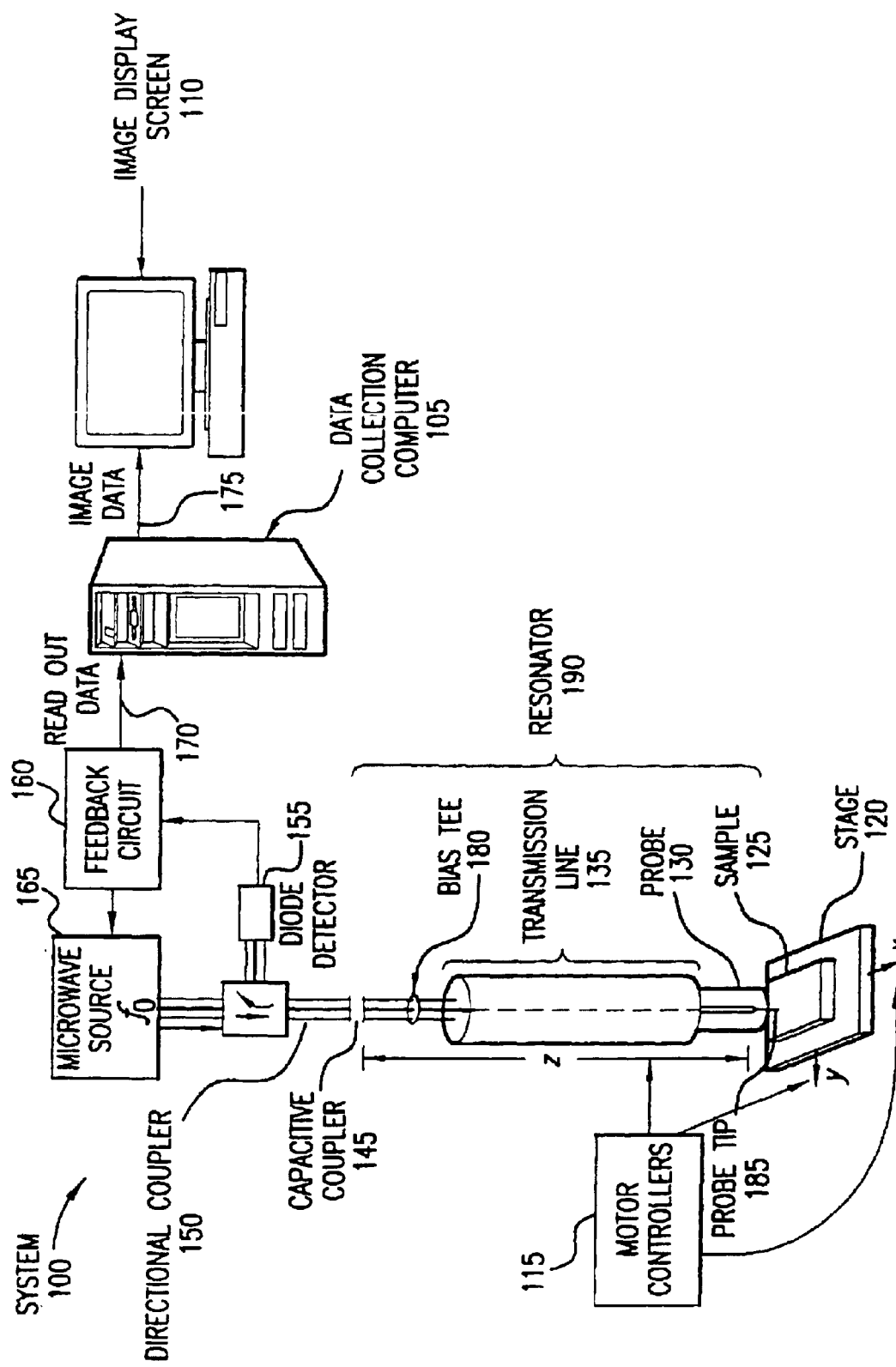
FIG. 1 illustrates the general structure and functionality of an embodiment of the present invention.

An apparatus according to an embodiment of the present invention is illustrated in FIG. 1. System 100 shows a near-field scanning microwave microscope having an open-ended coaxial probe 130 with a sharp, protruding center conductor 185. A coaxial transmission line resonator 135 is used for producing a resonance between the probe tip 185 and the capacitive coupler 145. The microwave signal source 165 is responsible for generating a microwave signal. The feedback circuit 160 receives a reflected microwave signal from the coaxial transmission line resonator 135. Feedback circuit 160 also keeps the microwave signal source 165 locked onto a predetermined resonance. An additional function of the feedback circuit 160 is to calculate a value for at least one parameter related to a change in the resonance due to the dielectric properties of a sample 125. Two possible parameters measured are resonant frequency shift ($\Delta f$) and quality factor (Q). A stage 120 is used to support the sample 125 in contact with the sharp protruding center conductor 185. Alternatively, with respect to FIG. 2 described in more detail below, a further embodiment of the present invention has a spring-loaded cantilever sample holder 210 provided to hold the sample relative to the sharp protruding center conductor 185 and stage 120.

System 100 further includes motor controllers 115 for manipulating the sample 125 in contact with the sharp protruding center conductor 185 in a first, second, or third direction; for example, the sample can be moved and/or rotated along the x, y and z axes. A coupler 150 is attached between the microwave signal source 165 and the coaxial transmission line resonator 135. Coupler 150 could be a directional coupler, circulator, or other device for directing microwave signals known to one of ordinary skill in the art. The coupler initially directs the microwave signal towards the sample 125 and then directs the reflected microwave signal towards the feedback circuit 160.

A detector 155 is responsible for converting the reflected signal directed towards the feedback circuit 160 into a voltage signal representative of detected power. A computer 105 having both memory and a processor is also shown. The memory of computer 105 stores electric field configuration data files used for quantitative modeling. Computer 105 also stores calibration sample frequency shift values and test sample frequency shift values. The processor of computer 105 mathematically determines the functional relationship between at least one parameter related to a change in the resonant frequency shift and a known dielectric property value of a sample responsible for the change. An example of such a parameter is relative dielectric permittivity ($\in_r$). The processor of computer 105 is then able to receive from feedback circuit 160 resonant frequency shift values for a sample with unknown dielectric properties and determine the value of the unknown dielectric property based upon the model frequency shift-dielectric property relationship. Display device 110 is provided for displaying the value of the dielectric property once it has been determined by the processor 105.

Figure 2:
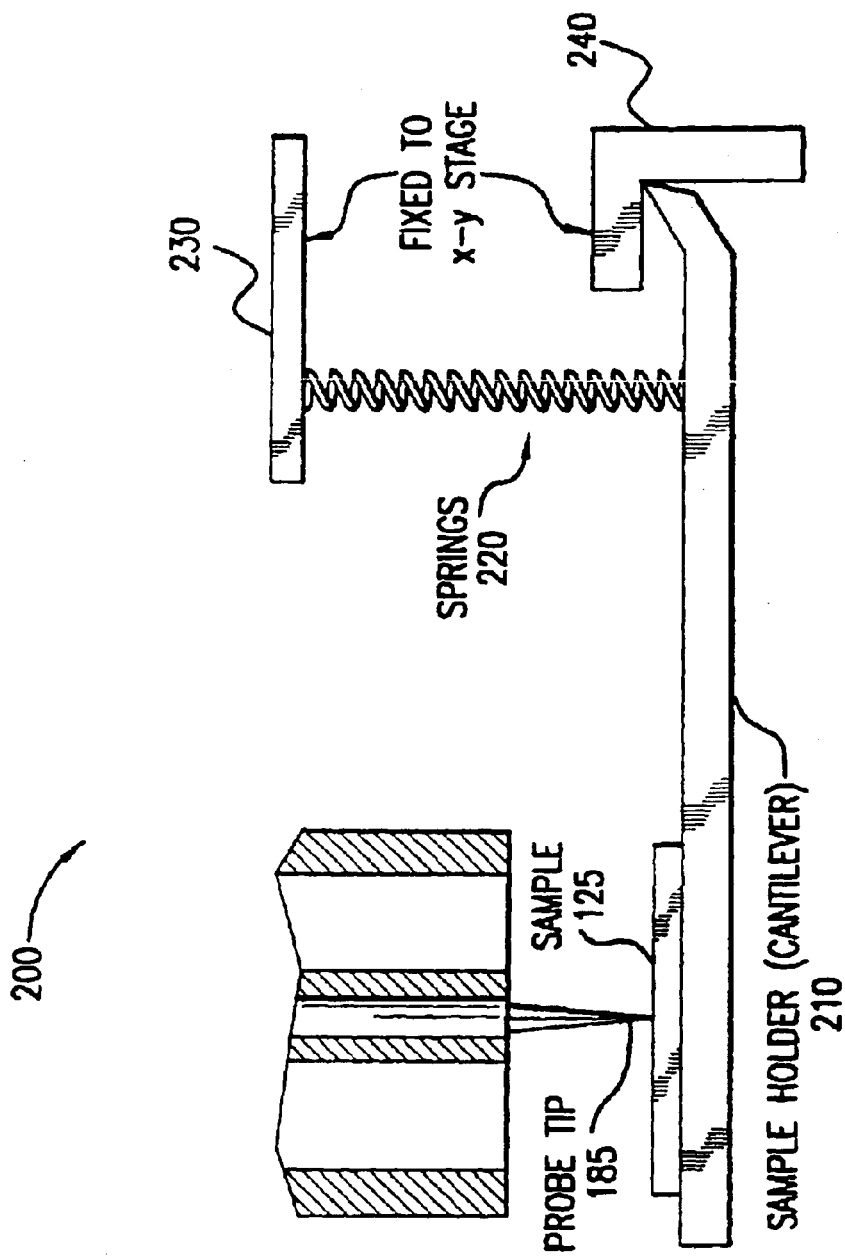
FIG. 2 illustrates the use of a spring-loaded cantilever sample support according to an embodiment of the present invention.

FIG. 2 illustrates an alternative embodiment for the present invention where a spring-loaded sample support 200 is used to support the sample 125 beneath the probe tip 185. Sample support 200 uses a cantilever sample holder 210 having an angled end and a planar surface for supporting sample 125. A first bracing device 230 is fixed to the x-y stage and is joined to sample holder 210 by a spring 220. The spring 220 is positioned such that it is in close proximity to the pivot point created when the angled portion of sample holder 210 is brought into contact with a second bracing device 240 also attached to the x-y stage. This spring cantilever design allows the force applied by the probe tip 185 to remain substantially constant during scanning. Excessive wear of the probe tip during contact mode scanning is also reduced The amount of force applied can be set by selecting an appropriate spring and adjusting the location of the spring and/or sample along the cantilever sample holder 210. In one example, a force of about 50 $\mu$N (microNewtons) is applied between the probe tip and sample 125.

Figure 3:
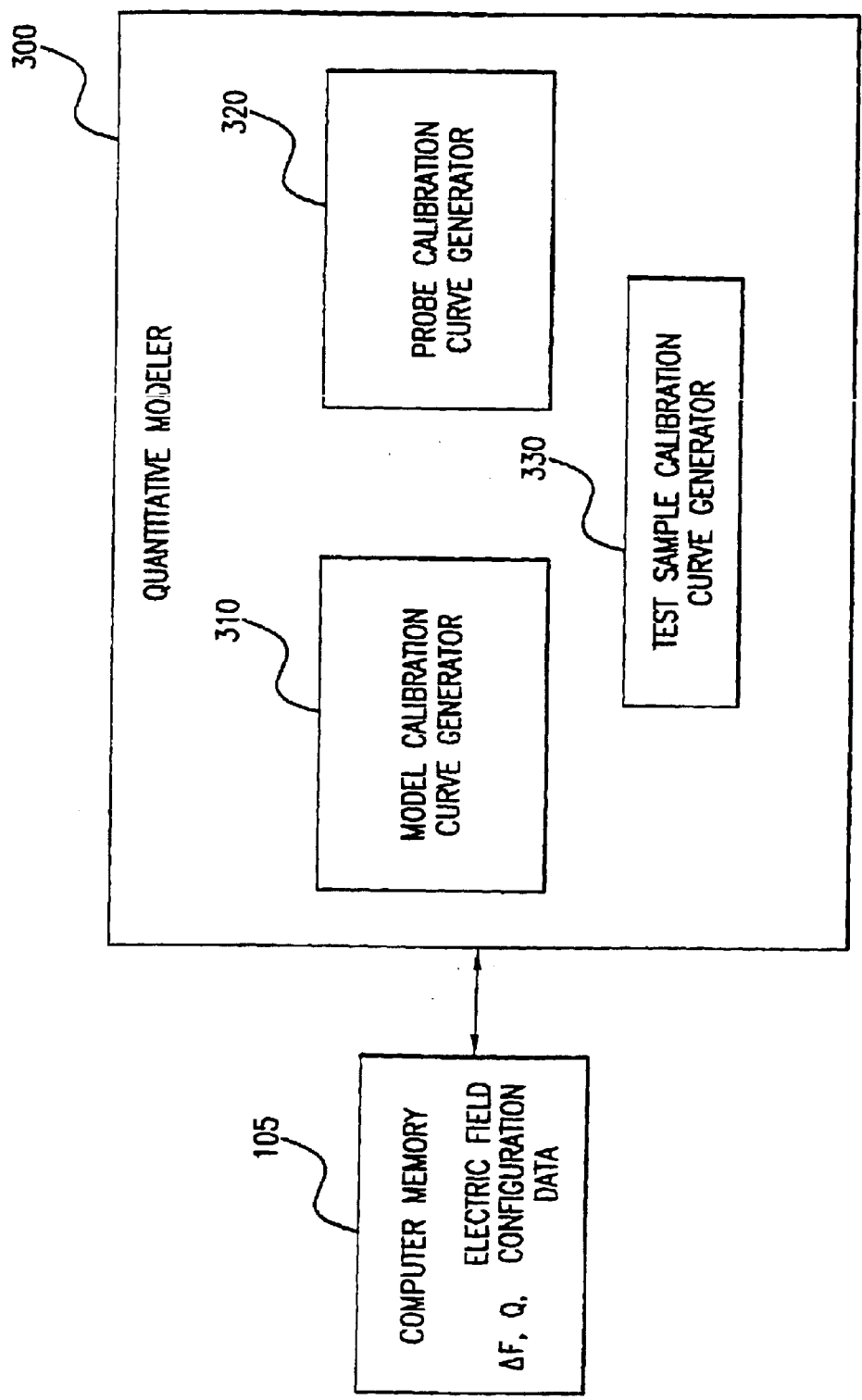
FIG. 3 is a diagram of a quantitative modeler used in an embodiment of the present invention.

System 100 also has a quantitative modeler described in FIG. 3 for determining the model frequency shift-dielectric property relationship. Quantitative modeler 300 receives resonant frequency shift values for calibration samples with known dielectric properties and test samples with unknown dielectric properties from computer 105 memory. Quantitative modeler 300 provides the measured resonant frequency shift data to Model calibration curve generator 310 Probe calibration curve generator 320 and Test sample curve generator 330 in order to generate data (such as, tables, graphs, files or curves) showing the relationship between a measured resonant frequency shift and a particular dielectric property. In particular, Model calibration curve generator 310 generates model calibration curves at different values of a geometric descriptor that show the relationship between a measured resonant frequency shift ($\Delta f$) and a dielectric property (e.g. permittivity $\in_r$) for calibration reference samples. The operation of Model calibration curve generator 310 is further described with reference to FIGS. 12 and 13. Probe calibration curve generator 320 and Test sample calibration curve generator 330 generate calibration curves drawn from the model calibration curves and a geometric descriptor value of the probe tip 185. The calibration curves show the relationship between a resonant frequency shift ($\Delta f$) measured during scanning and a dielectric property (e.g. permittivity $\in_r$) at a geometric descriptor value of the actual NSMM used in imaging. The calibration curve allows a dielectric property to be determined by finding the point on the curve corresponding to the resonant frequency shift measured during scanning. The operation of Probe calibration curve generator 320 and Test calibration curve generator 330 is further described with respect to FIGS. 9, 12, 14 and 17.

It is helpful to begin with discussion of quantitative modeling according to the present invention with reference to FIGS. 4 to 8, and 16. Operation of the present invention is then further described with respect to FIGS. 9–15.

Quantitive Modeling
Calculating the Electric Field Near the Probe Tip

In order to arrive at quantitative results, the inventors developed a physical model for the system, starting with the simplest case of a uniform bulk sample. Because the probe tip length is much smaller than the free space wavelength of the microwaves (~4 cm), a static calculation of the microwave electric fields is performed. Cylindrical symmetry further simplifies the problem to two dimensions. Because of the complicated geometry of the probe tip in contact with a potentially multi-layered sample, a finite element model on a grid is used. Using relaxation potential $\Phi$ in the region represented by the grid and taking into account any changes in the permittivity $\in_r$ yields:

$$\nabla^2 \Phi + \frac{1}{\varepsilon_r}(\nabla \Phi) \cdot (\nabla \varepsilon_r) = 0 \quad (1)$$

Using a rectangular grid, the inventors represent the probe tip as a cone with a blunt end of radius $r_o$, and perform the calculation in a spreadsheet program.

Figure 16:
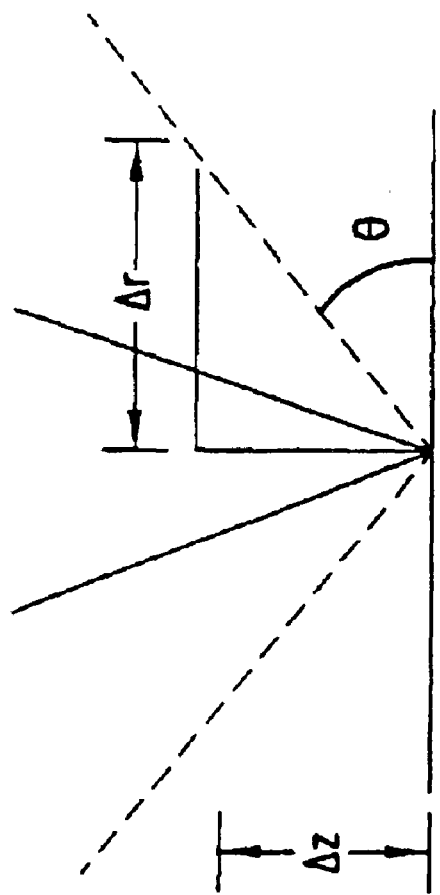
FIG. 16 illustrates a probe tip geometry descriptor according to an embodiment of the present invention.

From Eq. (1), if $\Phi_{ij}$ is the potential at the cell at column i and row j, $\Phi_{ij}$ is a weighted average of the values of the four adjacent cells:

$$\Phi_{ij} = \frac{\Phi_{i+1,j}\left(1 + \frac{\Delta r}{r}\right) + \Phi_{i-1,j} + \Phi_{i,j-1} + \Phi_{i,j+1}}{4 + \frac{\Delta r}{r}}, \quad (2)$$

where r is the radius from the cylindrical coordinate axis, referring to FIG. 16, $\Delta r$ and $\Delta z$ are the spacing between cells in the r and z directions, respectively, and $\Delta r=\Delta z$. Equation (2) is the simplest case; in practice, the equation is more complicated, such as at the interface between the dielectric sample ($\in_r>1$) and the air ($\in_r=1$). Near the probe tip where the electric field is the strongest, and hence, the most critical, the grid spacings $\Delta r$ and $\Delta z$ are small and uniform. Inside this box, $\Delta z=\Delta z_{in}=0.1$ μm, is fixed while the value of $\Delta r=\Delta r_{in}$ is uniform, but adjustable (0.5 μm$\leq\Delta r_{in}\leq$1.0 μm), to allow for probe tips with different sharpness. In FIG. 16, the geometry descriptor of a probe tip's sharpness is represented with an aspect ratio parameter $\alpha \equiv \Delta z_{in}/\Delta r_{in}$.

The boundaries of the grid should be sufficiently far away in order to minimize the effect of the chosen boundary conditions on the electric field near the probe tip. To accomplish this, outside a region close to the probe tip, the values of $\Delta r$ and $\Delta z$ continuously increase with distance away from the probe tip, allowing the outer radius of the grid to be at least 4 mm, and the height of the grid to be 2 mm. The resulting grid consists of 84×117 cells, which is small enough to be a manageable calculation with a modern personal computer. The top and outer boundary conditions are d$\phi$/dn=0 where n is the coordinate normal to the edge. At the bottom of the grid, which represents the bottom side of the 500 μm thick sample, $\phi$=0 is used for the boundary condition. To match this condition, the sample is placed on top of a metallic layer for scanning; this has the added benefit of shielding the microscope from the effects of whatever is beneath the sample, which could be difficult to model.

Two possible fitting parameters for the model are the geometry descriptor, i.e., aspect ratio a, and the radius $r_0$ of the blunt probe end. The inventors found that a satisfactory fit with data could be obtained by fixing $r_0$=(0.6 μm)/$\alpha$. This leaves $\alpha$ as a single fitting parameter to represent all probes; the inventors have found that typically 1<$\alpha$<2. When a is small, for example less than 1.5, the probe tip is considered to be blunt. When a is large, for example greater than 1.5, the probe tip is considered to be sharp.

Calculating the Frequency Shift of the Microscope

Figures 4, 5:
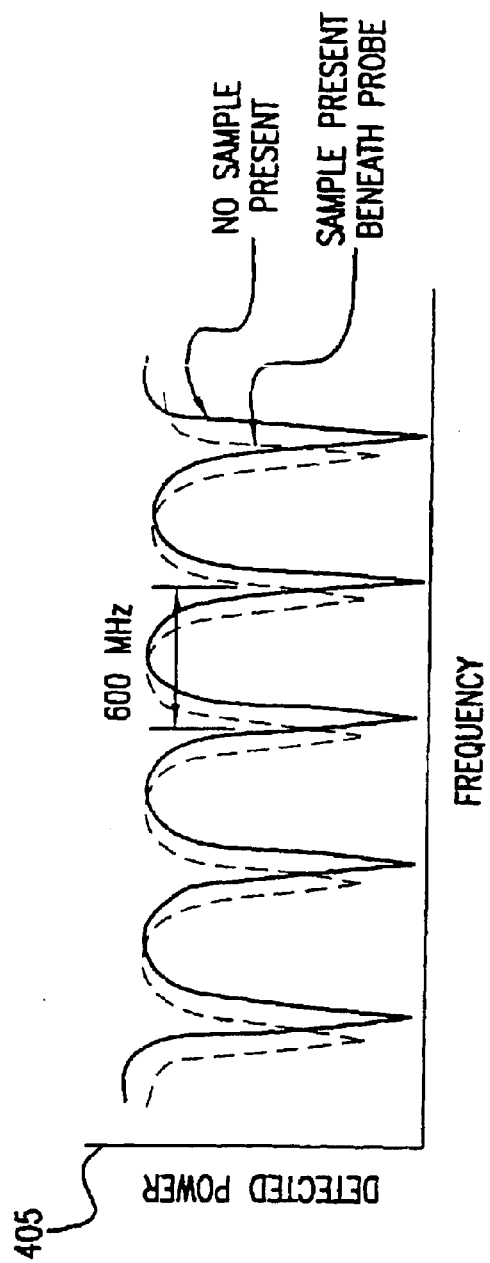
FIG. 4 illustrates a resonant frequency shift detected by measurements taken when a sample was present versus when a sample was not present.
FIG. 5 shows a perturbation formula used in an embodiment of the present invention.

Using perturbation theory, the frequency shift of the microscope is calculated as a function of the fields near the probe tip. FIG. 4 illustrates the cab frequency shift during an unperturbed state, i.e., no sample present and a perturbed state, i.e., sample present beneath the probe. The width of the minima change with respect to the changes in quality factor (Q). With reference to FIG. 5, $\in_{r1}$ and $\in_{r2}$ are defined as the permittivities of two model samples, the subscripts 1 and 2 indicating the unperturbed and perturbed system. If $\overline{E}_1$ and $\overline{E}_2$ are the calculated electric fields inside the two model samples, where $\overline{E}=-\nabla\Phi$, the frequency shift of the microscope upon going from sample 1 to sample 2 is $$\frac{\Delta f}{f} \approx \frac{\epsilon_0}{4W} \int_{V_S} (\epsilon_{r2} - \epsilon_{r1}) \vec{E}_1 \cdot \vec{E}_2 \, dV \quad (3)$$

where $\in_o$=8.85×10$^{-12}$ F/M is the permittivity of free space, W is the energy stored in the resonator, and the integral is over the volume $V_s$ of the sample. An approximate W is calculated using the equation for the loaded Q of the resonator, $Q_L=\omega_0 W/P_1$, where $\omega_0$ is the resonant frequency, and $P_1$ is the power loss in the resonator. In one example, a bare 500 μm thick LaAlO$_3$ (LAO) substrate is used for the unperturbed system because its properties are well-characterized ($\in_r$=24) and it is a common substrate for oxide dielectric thin films.

Figure 6:
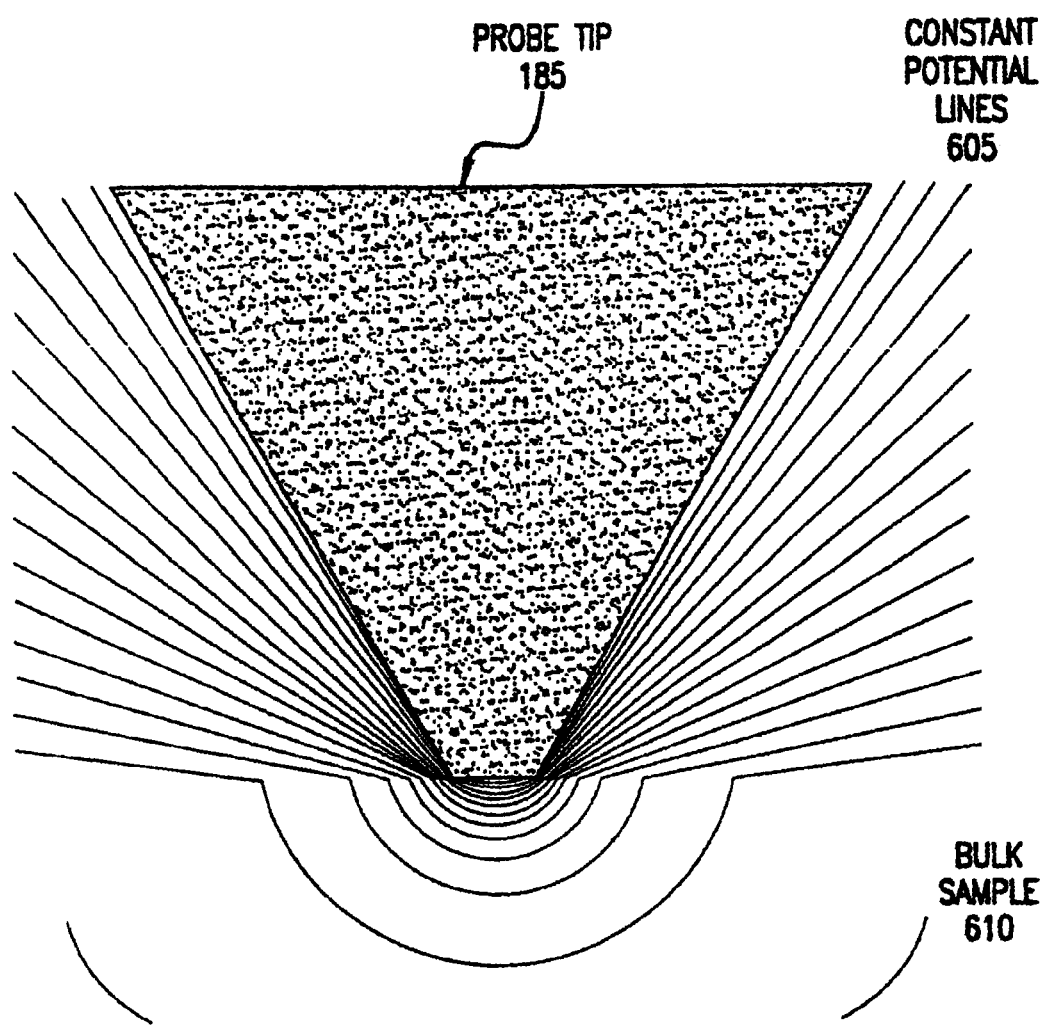
FIG. 6 is a diagram of the electric equipotential lines for a bulk sample according to a quantitative model of the present invention.

FIG. 6 illustrates the electric fields 605 present when a bulk sample 610 is scanned beneath probe tip 185.

Modeling of Dielctric Thin Films

Figure 7:
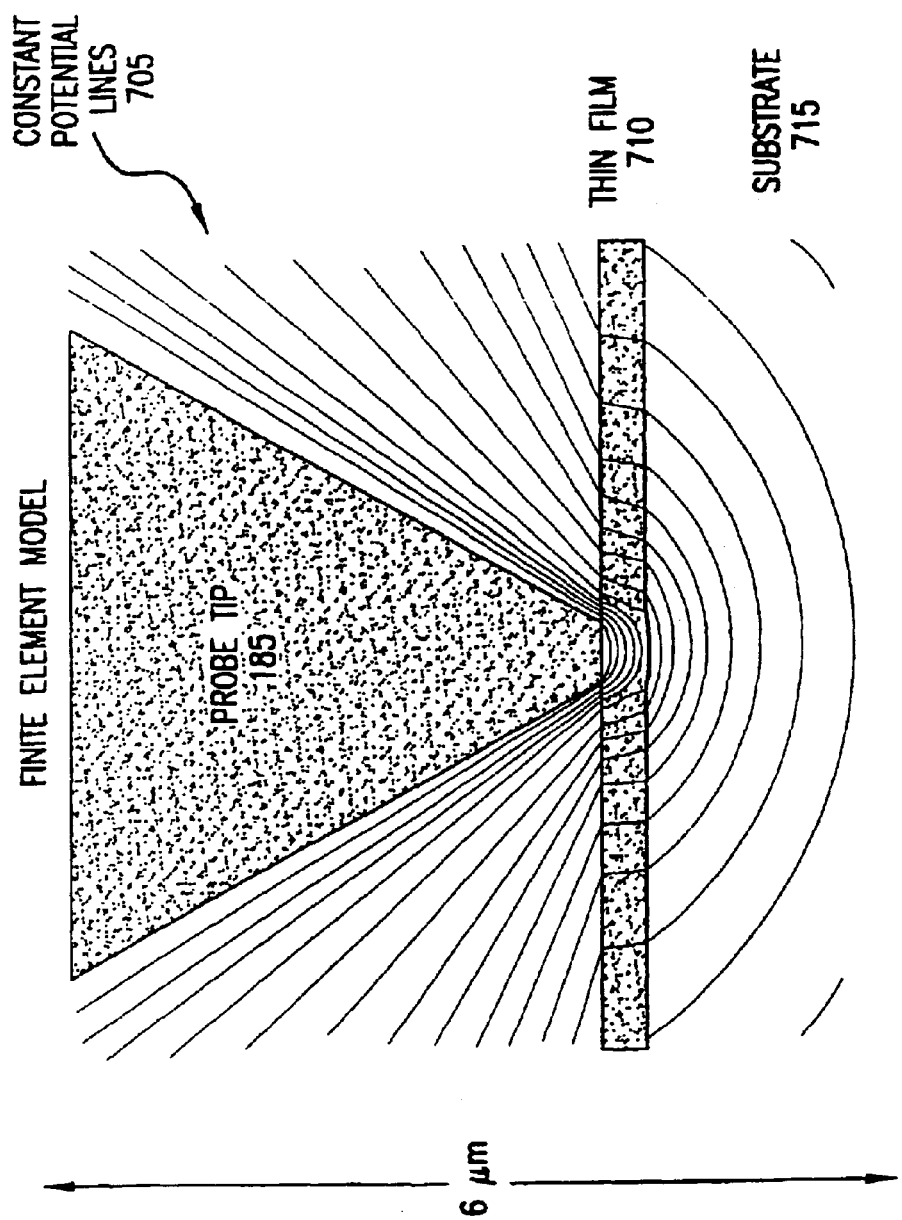
FIG. 7 is a diagram of the electric equipotential fields for a thin film sample according to a quantitative model of the present invention.

FIG. 7 illustrates the modeling of thin films. To provide for imaging of thin films, the finite element model is extended to include a thin film 710 on top of a dielectric substrate 715 having the same thickness as the model samples. As long as the thin film 710 is on a substrate having the same thickness as the model sample, the only perturbation is the thin film (the change in total thickness of the sample is negligible compared to the thick substrate). The electric field 705 in the thin film sample is calculated using the finite element model of the present invention and Eq. (3) to calculate $\Delta f$, integrating only over the volume of the thin film. Once a probe's $\alpha$ parameter is found using the process described above for bulk samples, the thin film model is used to obtain a functional relationship between $\Delta f$ and $\in_r$ of the thin film.

Figure 8:
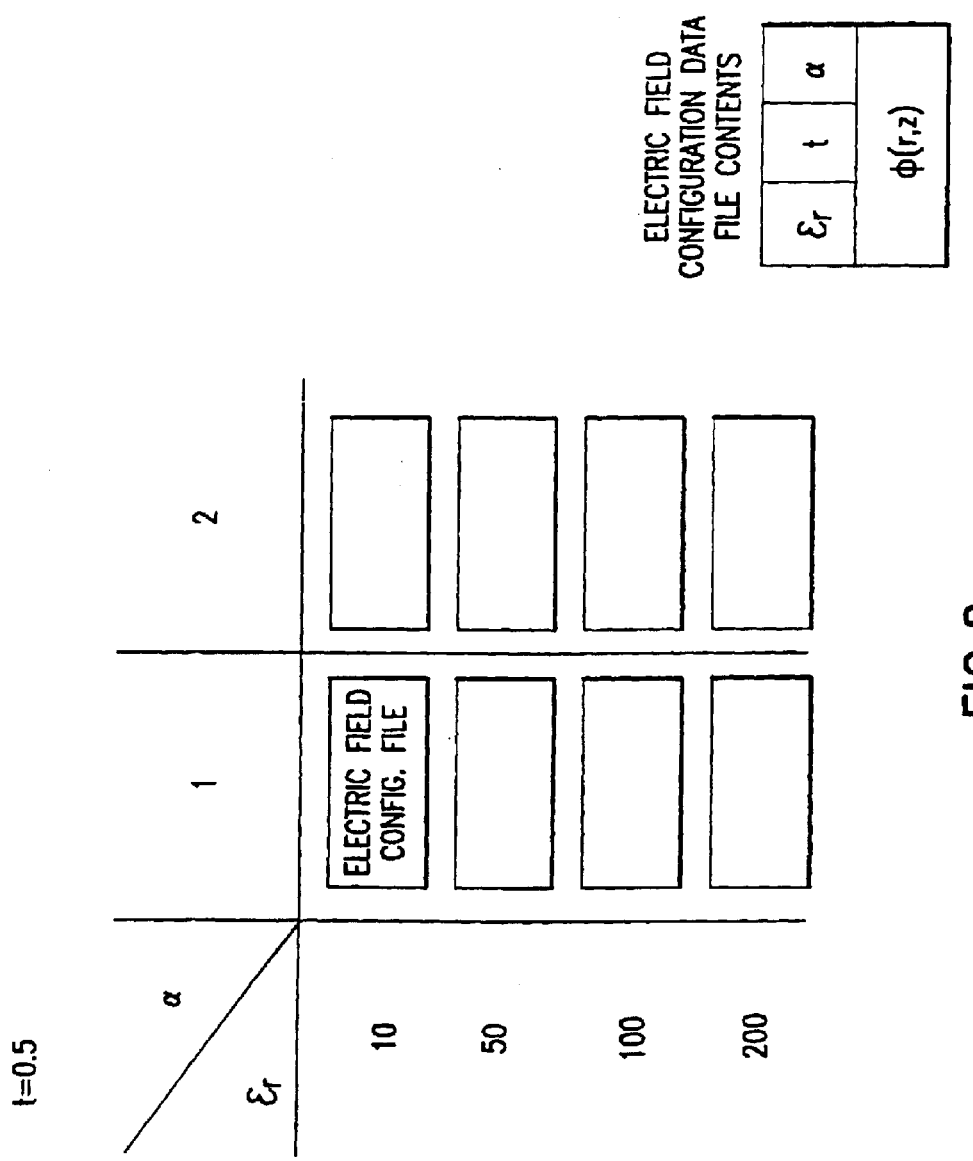
FIG. 8 is a diagram illustrating the modeling of the electric field near the microscope probe tip in an embodiment of the present invention.

In producing the quantitative models discussed above, samples are chosen so as to cover a range of permittivity values in which the dielectric permittivity of an unknown sample is expected to fall within. The known values $\in_r$ and t (thickness of the thin film 710) and the calculated values $\alpha$ and $\omega$ are all stored in electric field configuration data files respective to each sample. In FIG. 8 for example, quantitative modeling data has been generated using samples with dielectric permittivity values of 10 to 200 and probe tip geometry of $\alpha=1$ and $\alpha=2$. Accordingly, the electric field configuration data files are usable in cases where the dielectric permittivity for an unknown sample can be expected to be between 10 and 200.

The following articles are related to quantitative modeling according to the present invention and are incorporated by reference herein in their entirety:

"Imaging of microwave permittivity, tunability, and damage recovery in (Ba, Sr) TiO$_3$ thin films", D. E. Steinhauer, C. P. Vlahacos, F. C. Wellstood, Steven M. Anlage, C. Canedy, R. Ramesh, A. Stanishevsky, and J. Melngailis, *Applied Physics Letters*, Volume 75, Number 20, p. 3180 (1999); and "Non-Contact Imaging of Dielectric Constant with a Near-Field Scanning Microwave Microscope", C. P. Vlahacos, D. E. Steinhauer, Steven M. Anlage, F. C. Wellstood, Sudeep K. Dutta, and Johan B. Feenstra, *The Americas Microscopy and Analysis*, p. 5, January 2000.

Method of the Present Invention

Dielectric Permittivity Imaging

Figure 9:
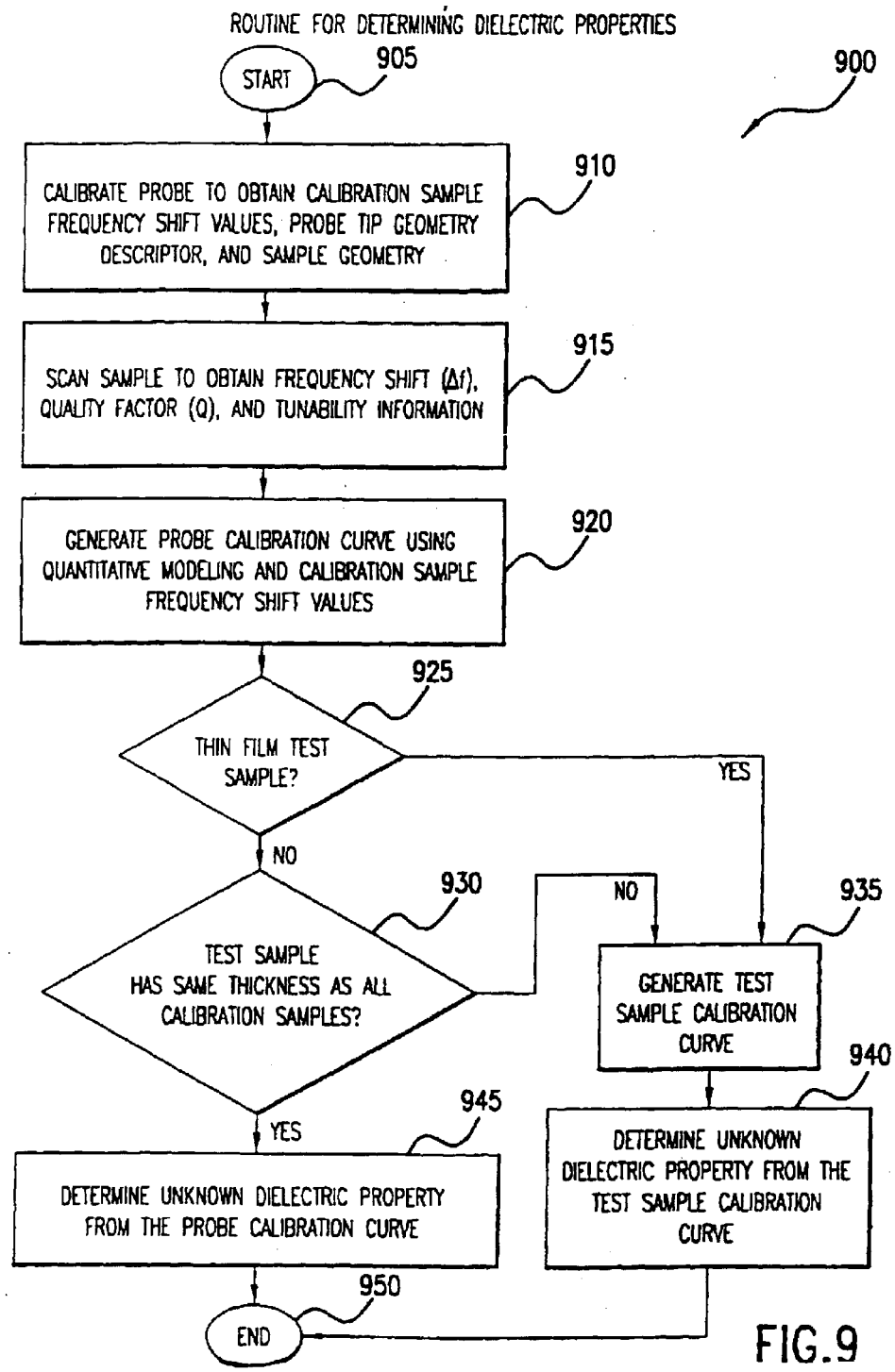
FIG. 9 is a flow chart illustrating a method for determining dielectric properties according to the present invention.

A method for an embodiment of the present invention is illustrated by flowchart 900 of FIG. 9. The method begins with a step 905. In a step 910, system 100 is calibrated according to the probe calibration routine described in FIG. 10 to obtain calibration sample frequency shift values ($\Delta f_{sample\ C}$), a probe tip geometry descriptor, and sample geometry.

Test Sample Scanning

Figure 11:
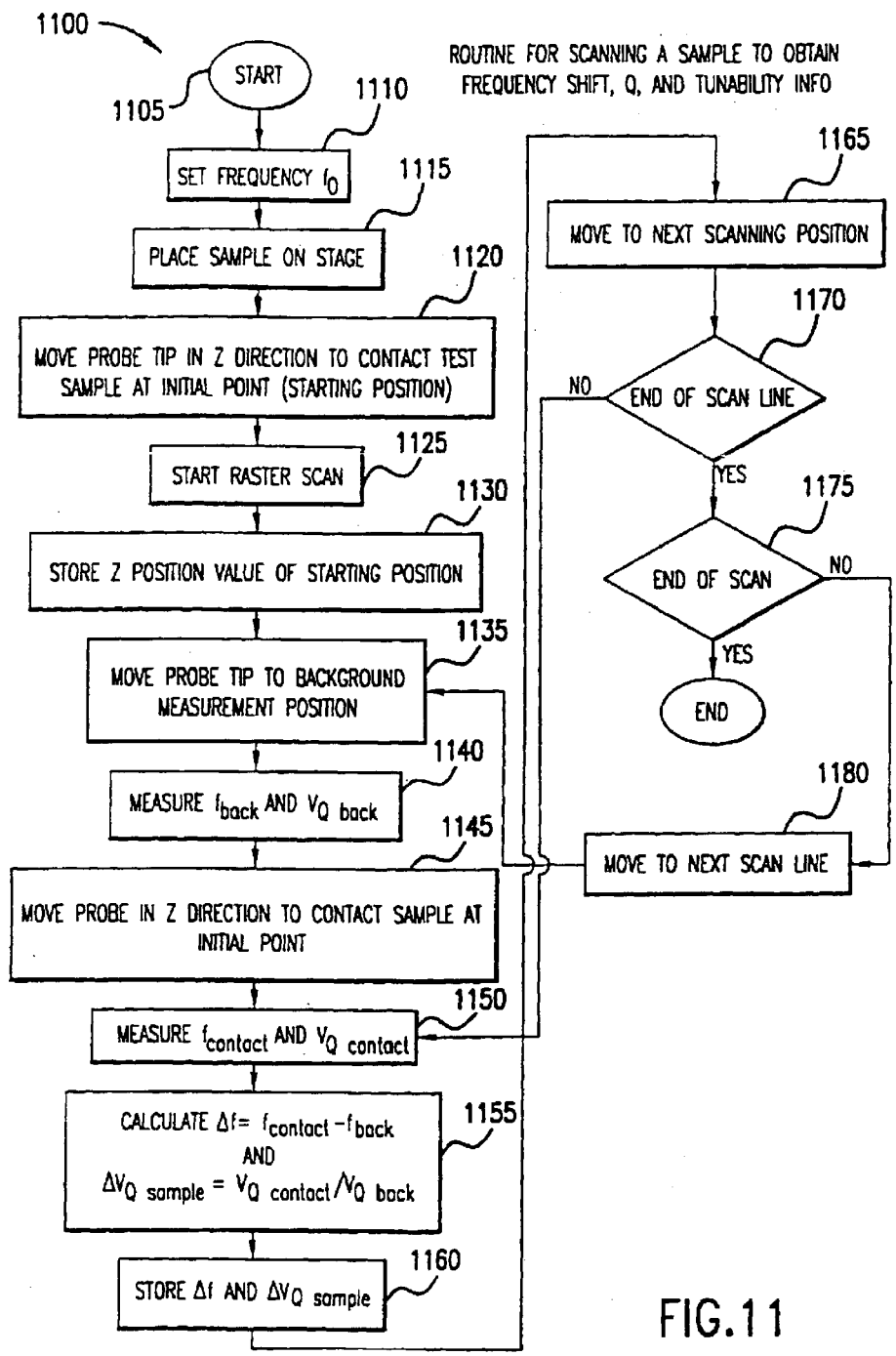
FIG. 11 is a flow chart depicting an embodiment of a scanning routine of the present invention.

In a step 915, a test sample 125 with unknown dielectric properties is scanned according to the routine described in FIG. 11 to obtain test sample resonant frequency shift measurements ($\Delta f_{sampleT}$). These measurements can also include determining quality factor (Q), and/or tunability information. If the test sample is a thin film then it contains both a dielectric thin film and substrate. Step 915 will now be described with reference to the steps provided in FIG. 11. The method begins with a step 1105. In a step 1110 a resonant frequency of the near-field scanning microwave microscope is selected. In a step 1115 a test sample is placed on the microscope stage. In a step 1120 the probe tip is moved into contact with the test sample. In a step 1125 raster scanning begins. In a step 1130 a position value corresponding to the initial point of contact with the test sample is stored in computer 105 memory as the next scanning point.

In a step 1135 the probe is moved to a predetermined background measurement position where the calibration sample no longer perturbs the resonator. For example, the predetermined background measurement position can be a height 1.5 times greater than the diameter of the microscope transmission line 135, or a height at least approximately 3 millimeters above the calibration sample. In a step 1140 a background resonant frequency shift measurement is taken from the background measurement position. In a step 1145 the probe tip is moved back into contact with the test sample at the next scanning point. In a step 1150 the contact resonant frequency shift at the scanning point is measured. In a step 1155 the difference between the contact resonant frequency shift at the scanning point and the background resonant frequency shift is calculated In a step 1160 the calculated difference is saved in computer 105 memory as the test sample resonant frequency shift value.

In a step 1165 the microscope probe tip is moved to the next scanning position. In a step 1170 computer 105 determines if the next scanning position is the end of a scan line. If the end of a scan line has not been reached then steps 1150 through 1165 are repeated. Next, at a step 1175 computer 105 determines if the next scanning position is the end of a scan area. If it is not then steps 1135 through 1170 are repeated until the end of a scan area has been reached. At the conclusion of step 915 a set of test sample resonant frequency values have been recorded or stored in computer 105 memory.

Figure 12:
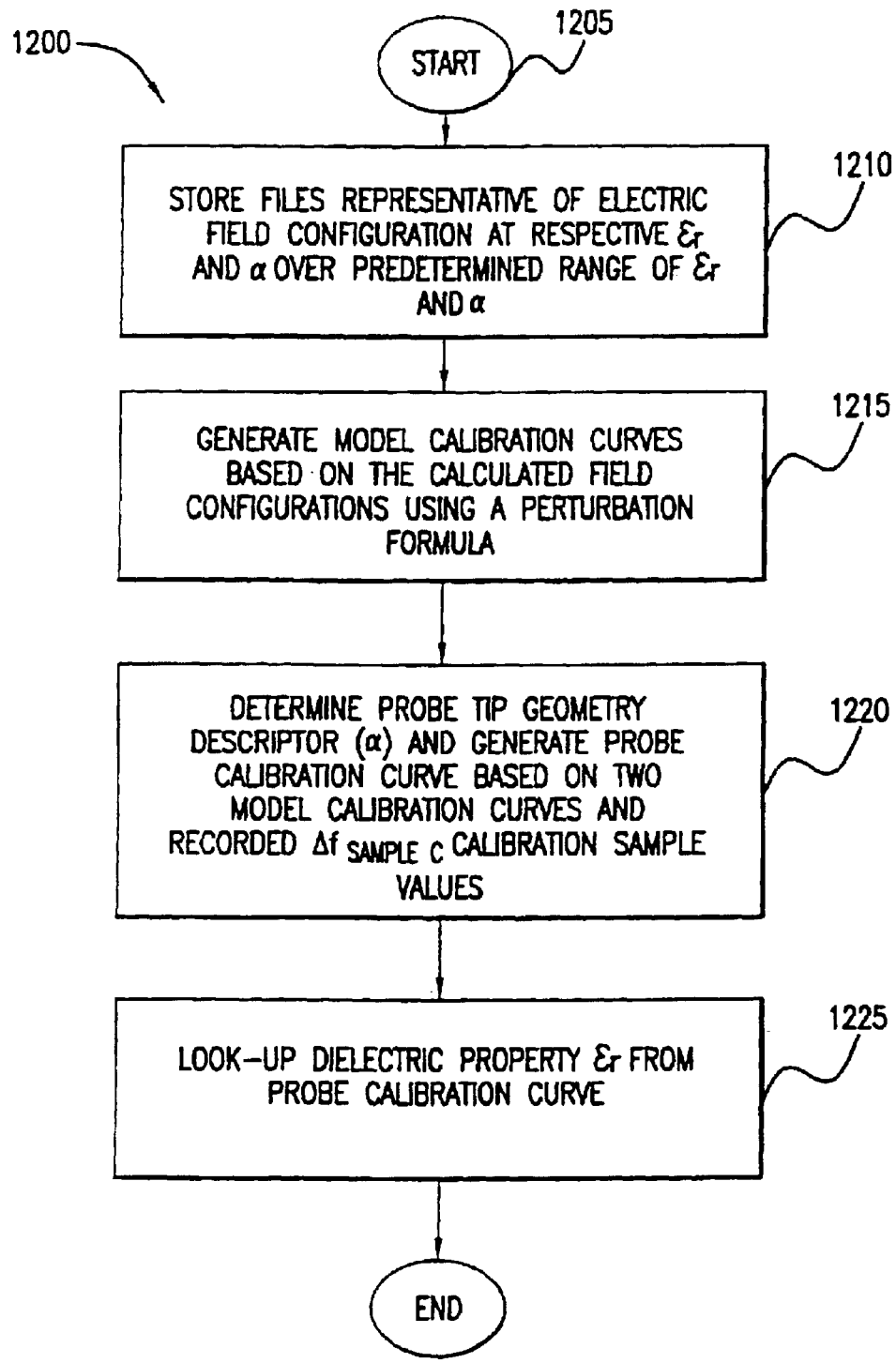
FIG. 12 is a flow chart depicting an embodiment of a probe calibration curve generating routine.

In a step 920, the calibration sample resonant frequency shift values obtained from step 910 are used to generate a probe calibration curve according to the routine described in FIG. 12. In a step 925, a determination of whether the test sample is a thin film is made. In a step 930, a determination of whether all of the calibration samples have the same thickness as the test sample is made. If the test sample is not a thin film, and all of the calibration samples have the same thickness as the test sample, then in a step 945, one is able to determine an unknown dielectric property for a sample by first retrieving a test sample resonant frequency shift value ($\Delta f_{sampleT}$) obtained in step 915 and then locating the corresponding $\Delta f$ value on the probe calibration curve resulting from step 920. The dielectric property of the test sample is equal to the dielectric property corresponding to the $\Delta f$ value on the probe calibration curve resulting from step 920. If the test sample is a thin film, or if only one calibration sample has the same thickness as the test sample, then in a step 935 a test sample calibration curve is generated. In a step 940 one is able to determine an unknown dielectric property for a test sample by first retrieving a test sample resonant frequency shift value ($\Delta f_{sampleT}$) obtained instep 915 and then locating the corresponding $\Delta f$ value on the test sample calibration curve resulting from step 940. The dielectric property of the test sample is equal to the dielectric property corresponding to the $\Delta f$ value on the test sample calibration curve. The process concludes with a step 950.

In an alternative embodiment, step 920 can be performed prior to step 915.

In a further embodiment, step 910 can be performed after step 915 but before step 920. Furthermore, steps 1135. 1140, and 1145 could alternatively be measured at each point on the sample, any desired number of times during the scan, before the scan, or after the scan.

Calibration

To measure the unknown dielectric permittivity ($\in_r$) of a dielectric sample, the NSMM is calibrated to determine the parameter a using at least two samples with known permittivity ($\in_r$) and thickness (t). The thickness of a bulk dielectric test sample or a thin film test sample on top of a dielectric substrate, is referred to as the first determined thickness. For thin film dielectric test samples the thickness of the thin film is referred to as the second determined thickness.

Figure 10:
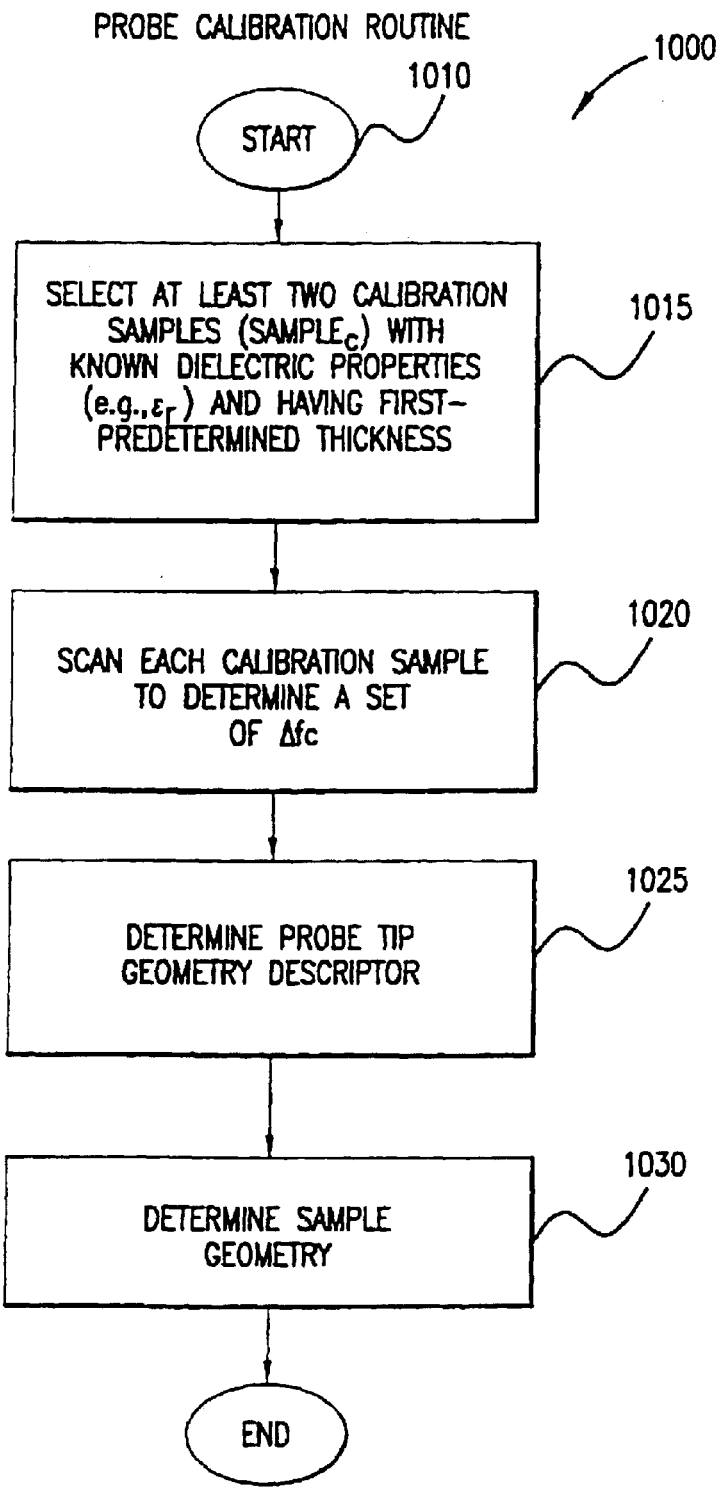
FIG. 10 is a flow chart depicting an embodiment of a calibration routine of the present invention.

The process of calibrating system 100 is illustrated by flowchart 1000 of FIG. 10. The process starts at a step 1010. At a step 1015, at least two calibration samples that have known dielectric properties are selected. At least two of the calibration samples have the same approximate thickness with one another. In addition, at least one of the calibration samples has the same in approximate thickness as the test sample with first determined thickness and unknown dielectric properties. If the test sample contains a thin film, an additional requirement is that the at least one calibration sample with approximate thickness equal to the test sample first determined thickness have the same permittivity as the substrate of the test sample.

Calibration Sample Scanning

In a step 1020, each selected calibration sample is scanned according to the scanning routine described in FIG. 11 to determine respective sets of resonant frequency shift information for samples with known dielectric permittivity values. The method begins with a step 1105. In a step 1110 a resonant frequency of the near-field scanning microwave microscope is selected. In a step 1115 a calibration sample is placed on the microscope stage. In a step 1120 the probe tip is moved into contact with the calibration sample. In a step 1125 raster scanning begins. In a step 1130 a position value corresponding to the initial point of contact with the calibration sample is stored in computer 105 memory as the next scanning point. In a step 1135 the probe is moved to a predetermined background measurement position where the calibration sample no longer perturbs the resonator. For example, the predetermined background measurement position can be a height 1.5 times greater than the diameter of the microscope transmission line 135, or a height at least approximately 3 millimeters above the calibration sample. In a step 1140 a background resonant frequency shift measurement is taken from the background measurement position. In a step 1145 the probe tip is moved back into contact with the calibration sample at the next scanning point. In a step 1150 the contact resonant frequency shift at the scanning point is measured. In a step 1155 the difference between the contact resonant frequency shift at the scanning point and the background resonant frequency shift is calculated. In a step 1160 the calculated difference is saved in computer 105 memory as the calibration sample resonant frequency shift value. In a step 1165 the microscope probe tip is moved to the next scanning position. In a step 1170 computer 105 determines if the next scanning position is the end of a scan line. If the end of a scan line has not been reached then steps 1150 through 1165 are repeated. Next, at a step 1175 computer 105 determines if the next scanning position is the end of a scan area. If it is not then steps 1135 through 1170 are repeated until the end of a scan area has been reached. Step 1020 is repeated for each calibration sample.

At a step 1025, a geometry descriptor of the probe tip is determined. The geometry descriptor can be input by a user or calculated by System 100. A geometry descriptor can be any descriptor representative of the geometry of the probe tip. Accordingly, in one embodiment of the present invention, a geometry descriptor is referred to as a first probe tip geometry descriptor value and a second probe tip geometry descriptor value. In another embodiment, an aspect ratio $\alpha = \Delta z/\Delta r$ is used where, $\Delta z$ is a distance along a direction parallel to a length of the resonator and the probe tip and $\Delta r$ is a radius distance extending from the central axis of the probe tip 185 to its outermost surface.

At a step 1030, sample geometry data is input. For example, with bulk samples, sample geometry data includes the thickness of the sample. For thin film samples on a bulk substrate, the thickness of the thin film is provided as well.

Calibration Curve Generation

FIG. 12 describes the routine for generating a calibration curve. The routine begins at a step 1205. At a step 1210 electric field configuration data is stored as described in FIG 8. The stored files contain data for model samples having approximately the same thickness as the calibration sample scanned in step 1020. At least one file for each value of a has the same permittivity value as one of the calibration samples scanned in step 1020. This permittivity is defined to give the unperturbed system, with $\Delta f = 0$.

Figure 13:
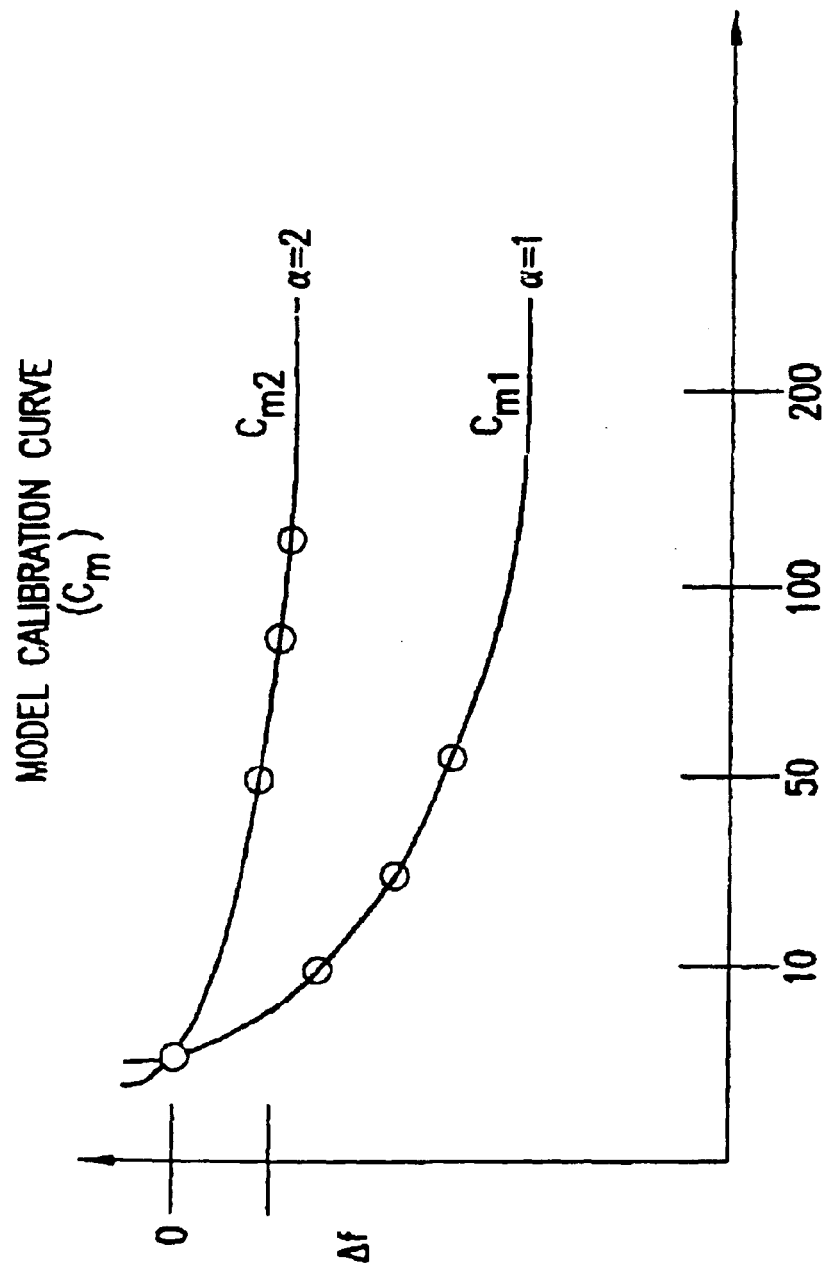
FIG. 13 is a diagram representative of quantitative modeling curves generated in an embodiment of the present invention.

At a step 1215 model calibration curves are generated by reading from at least two of the previously stored electric field configuration data files, electric field values and permittivity values for at least two respective probe tip geometry descriptor values. FIG. 13 provides an example of model calibration curves for $\alpha = 1$ and $\alpha = 2$. To generate the model calibration curve where $\alpha = 1$, a first previously stored electric field value ($E_1$) and a first permittivity value ($\epsilon_{r1}$) is chosen to represent the zero point ($\Delta f = 0$). A second electric field configuration data file where $\alpha = 1$ is then read to obtain a second previously stored electrical field value ($E_2$) and a second permittivity value ($\epsilon_{r2}$). A point on the first model calibration curve is then generated by solving the equation $$\frac{\Delta f}{f} \approx \frac{\epsilon_0}{4W} \int_{V_s} (\epsilon_{r2} - \epsilon_{r1}) \vec{E}_1 \cdot \vec{E}_2 \, dV$$

Multiple points on the first model calibration curve can be generated by repeating step 1215 for different values of $\epsilon_{r2}$ and $E_2$. The second model calibration curve for $\alpha = 2$ is generated as described above except that electric field configuration data files where a equals two are used instead.

Figure 14:
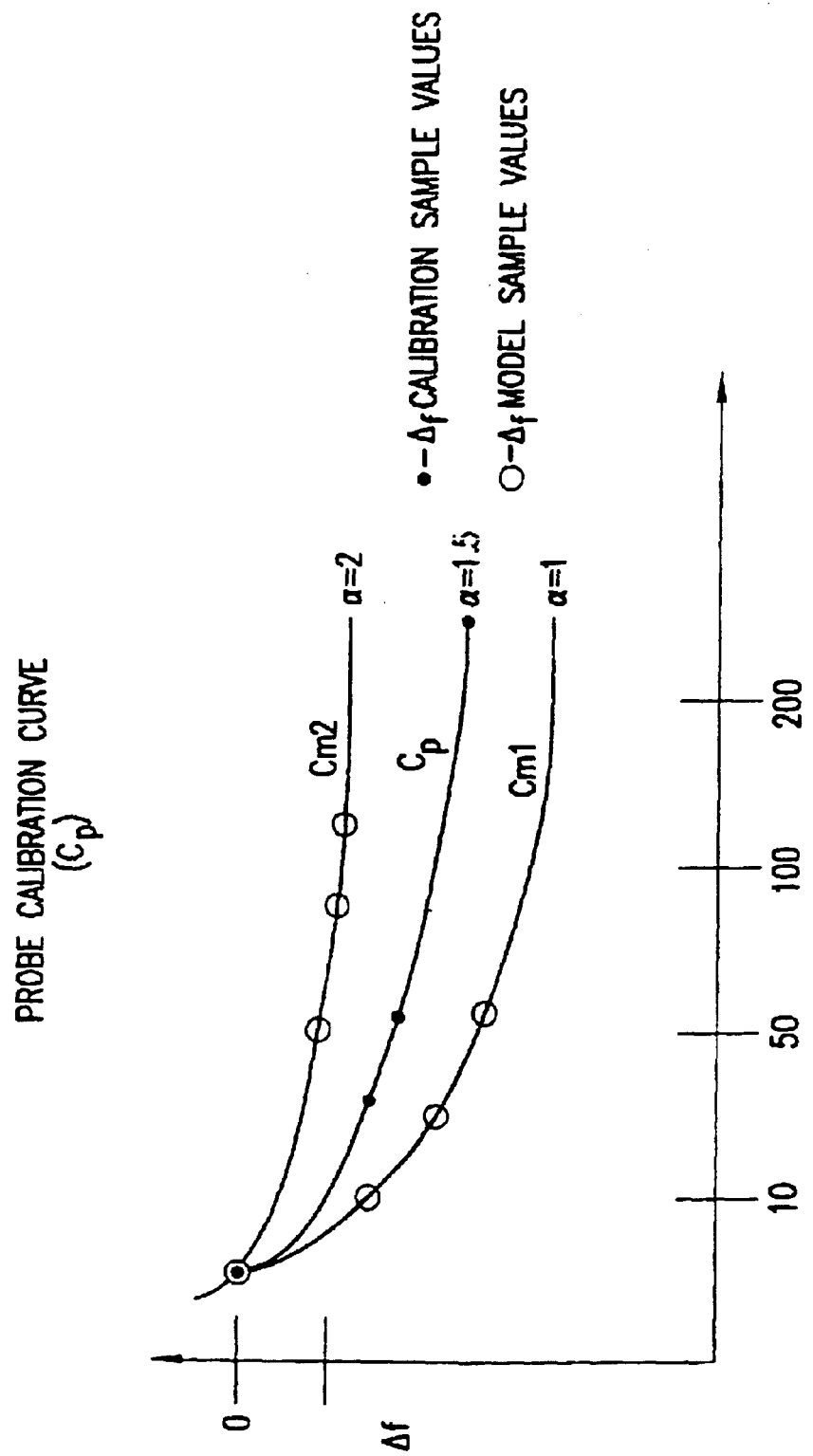
FIG. 14 is a diagram representative of a calibration curve generated in an embodiment of the present invention.

At a step 1220, a calibration curve is generated using the model calibration curves from step 1215 and the calibration sample frequency shift values from step 1020. A point on the calibration curve is generated by first calculating the difference between two calibration sample frequency shift values. One of the calibration frequency shift values used in the calculation should correspond to zero point permittivity value from step 1215. Once the difference value has been determined it can be plotted with respect to the $\Delta f$ axis of the model calibration curve. FIG. 14 provides an example where four calibration points have been plotted with respect to the model calibration curve of FIG. 13 to produce a calibration curve for $\alpha = 1.5$. The value for ca for the probe is determined by observing the position of the curve $C_p$ relative to the curves $C_{m2}$ and $C_{m1}$.

Test Sample Calibration Curve Generation

If the test sample is a thin film sample, or if only one calibration sample has the same thickness as the first determined thickness of the test sample, then a separate test sample calibration curve must be generated, in step 935.

Figure 17:
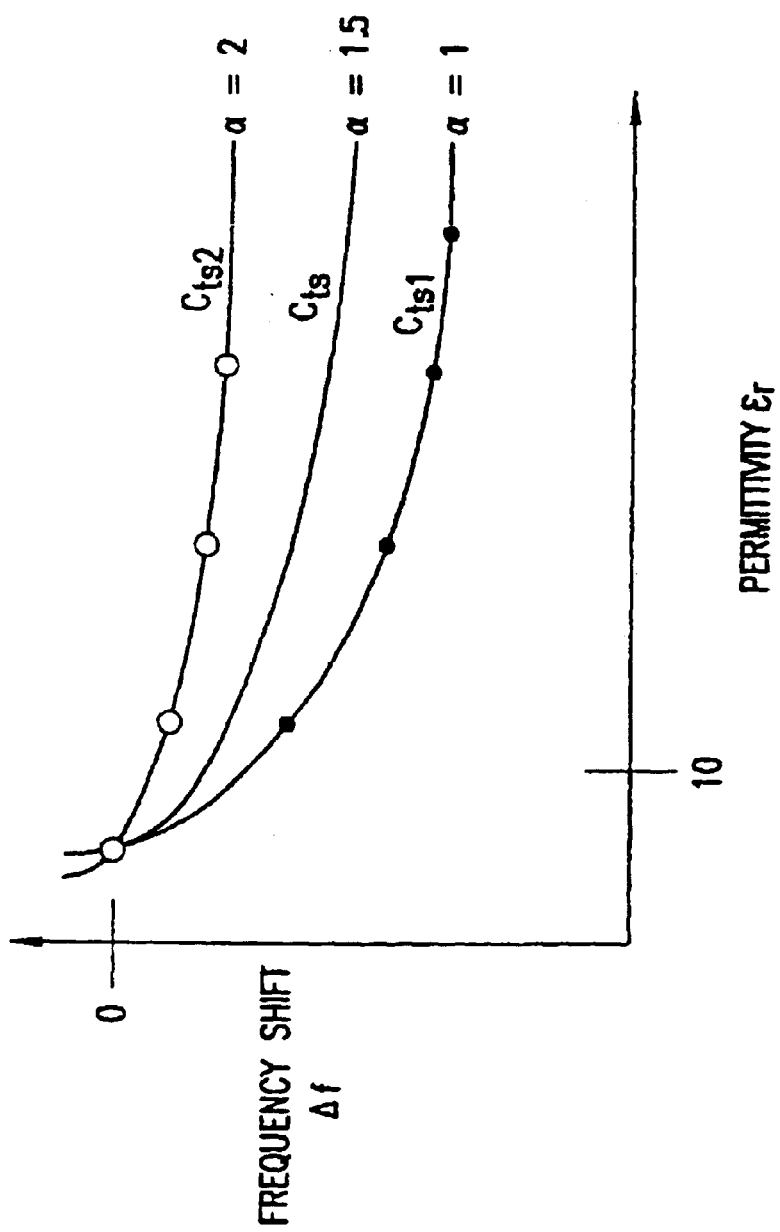
FIG. 17 is a diagram representative of a calibration curve generated in an embodiment of the present invention.

An example test sample calibration curve $C_{ts}$ is shown in FIG. 17. The curve $C_{ts}$ is used in step 940 to convert the frequency shift values obtained in step 915 to the values of the permittivity of the test sample. The curve $C_{ts}$ can be calculated using one of two methods. For the first method, the calculation is done for the specific value of a determined in step 920 (such as $\alpha = 1.5$, as shown in FIG. 17). For the second method, the calculation is done for two or more values of $\alpha$, shown in FIG. 17 as the curves $C_{ts1}$ and $C_{ts2}$. Then, the curve $C_{ts}$ is calculated for the value of a determined in step 920 by interpolating between the curves $C_{ts1}$ and $C_{ts2}$. The advantage of the second method is that generating the curves $C_{ts1}$ and $C_{ts2}$ can be done in advance just once, requiring less calculation for each scan.

For the case where the test sample is a bulk sample, and only one calibration sample has the same thickness as the test sample, the curves in FIG. 17 are calculated using the same method as was performed in the previous section with the probe calibration curve. The difference is that a new set of files (represented in FIG. 8) are used, which represent a sample thickness equal to the test sample thickness. The frequency shift measured with the NSMM for the calibration sample having the same thickness as the test sample (done in step 910) is defined as Δf=0 for the test sample calibration curves in FIG. 17.

For the case of a thin film test sample, the curves $C_{ts1}$ and $C_{ts2}$ in FIG. 17 are calculated according to the routine described in FIG. 12. However, a different set of files represented in FIG. 8 is now used. In this new set, the files represent a thin film having a thickness equal to the second determined thickness of the thin film in the test sample. The volume $V_S$ is the volume of the thin film, rather than the volume of the entire sample. The frequency shift measured with the NSMM for the calibration sample which has the same thickness as the test sample, and the sample permittivity as the test sample substrate, is defined as Δf=0 for the curves in FIG. 17.

Nonlinear Dielectric Imaging

Figure 15:
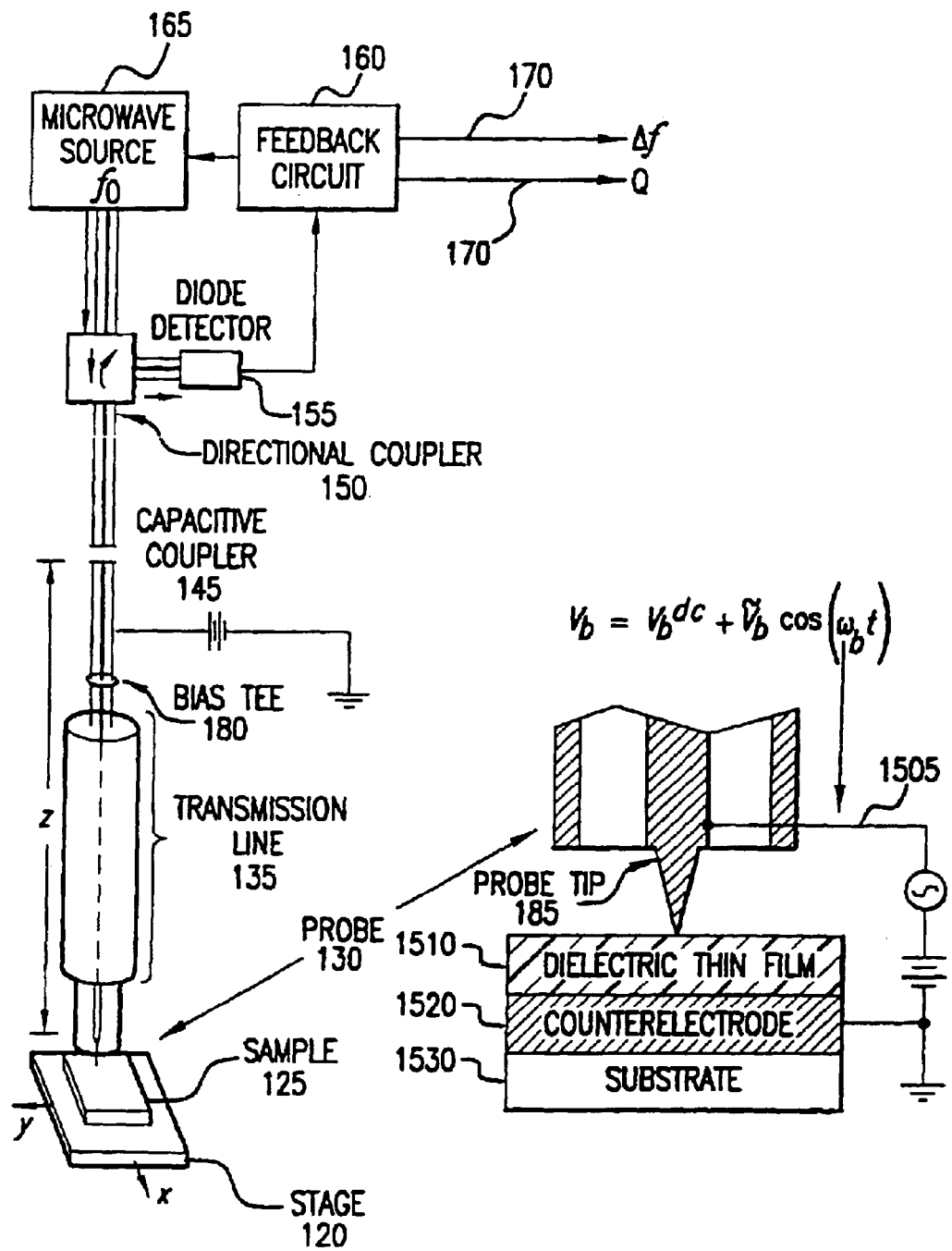
FIG. 15 illustrates the use of a modulating bias voltage to measure dielectric nonlinearity according to an embodiment of the present invention.

FIG. 15 illustrates how electric field-dependent imaging can be accomplished by applying a voltage bias ($V_b$) 1505 to the probe tip via a bias tee 180 in the resonator according to a further feature of the present invention. A metallic layer 1520 beneath the thin film 1510 acts as a grounded counterelectrode.

As shown in FIG. 15, a sample 125 can be a dielectric thin film 1510. The dielectric thin film 1510 is disposed on a grounded counterelectrode 1520. The grounded counterelectrode 1520 is provided on a substrate 1530. In order to prevent the counterelectrode 1520 from dominating the microwave measurement (modeling of the system has shown this to be a potential problem), the inventors use a high-sheet-resistance counterelectrode, making it virtually invisible to the microwave fields. As a result, the presence of the thin-film counterelectrode 1520 can be safely ignored in the finite element model described above. Because the counterelectrode 1520 is immediately beneath the dielectric thin film, the applied electric field is primarily in the vertical direction, unlike the microwave electric field, which is mainly in the horizontal direction for thin films with large permittivities. Also, by simulating the applied field using a finite element model similar to that presented above, the inventors find that the applied electric field beneath the probe tip is approximately uniform and equal to $E_b = V_b/t_f$ where $t_f$ is the thickness of the dielectric thin film.

By modulating the bias voltage 1505 applied to the probe tip, nonlinear terms in the permittivity can be extracted. Expanding the electric displacement D in powers of the electric field E, and keeping only the nonzero terms yields $$D_1(E) = \varepsilon_{11}E_1 + \frac{1}{2}\varepsilon_{113}E_1 E_3 + \frac{1}{6}\varepsilon_{1133}E_1 E_3^2 + \ldots \quad (4)$$

where $E_1$ is the rf electric field in the r direction, and $E_3 = E_b$ is the applied bias electric field in the z direction.

Adding a low-frequency oscillatory component ($\omega_b = 1$ kHz, with an amplitude of $\tilde{V}_b = 1$ V, for example) to the bias voltage, the applied electric field is $E_b = E_b^{dc} + \tilde{E}_b \cos\omega_b t$. The effective rf permittivity is then $$\varepsilon_{rf} = \varepsilon_{11} + \varepsilon_{113}E_b^{dc} + \varepsilon_{1133}\left(\frac{(E_b^{dc})^2}{2} + \frac{\tilde{E}_b}{4}\right) + \quad (5)$$

$$(\varepsilon_{113} + \varepsilon_{1133}E_b^{dc})\tilde{E}_b\cos(\omega_b t) + \frac{1}{4}\varepsilon_{1133}\tilde{E}_b^2\cos(2\omega_b t) + \ldots$$

Note that the components of $\varepsilon_{rf}$ at $\omega_b$ and $2\omega_b$ are approximately proportional to $\varepsilon_{113}$ and $\varepsilon_{1133}$, respectively. Expanding the resonant frequency of the microscope as a Taylor series about $f_0(\varepsilon_{rf}=\varepsilon_{11})$, yields $$f_0[\varepsilon_{rf}(t)] = f_0(\varepsilon_{11}) + \frac{df_0}{d\varepsilon_{rf}}\bigg|_{\varepsilon_{rf}=\varepsilon_{11}} [\varepsilon_{rf}(t) - \varepsilon_{11}] + \ldots \quad (6)$$

Substituting Eq. 5 into Eq. 6, and keeping only the larger terms, $$f_0(t) \approx \text{constant} + \quad (7)$$

$$\varepsilon_{113}\tilde{E}_b \frac{df_0}{d\varepsilon_{rf}}\bigg|_{\varepsilon_{11}} \cos(\omega t) + \frac{1}{4}\varepsilon_{1133}\tilde{E}_b^2 \frac{df_0}{d\varepsilon_{rf}}\bigg|_{\varepsilon_{11}} \cos(2\omega t).$$

Thus, the components of the frequency shift signal at $\omega_b$ and $2\omega_b$ can be extracted to determine the nonlinear permittivity terms $\varepsilon_{113}$ and $\varepsilon_{1133}$. These nonlinear terms can be measured simultaneously with the linear permittivity ($\varepsilon_{11}$) while scanning.

As an alternative, the electric field $E_b$ could be applied in the horizontal direction using thin film electrodes deposited on top of the dielectric thin film. The advantage here is that diagonal nonlinear permittivity tensor terms could be measured, such as $\varepsilon_{111}$ and $\varepsilon_{1111}$; the disadvantage in this case is that imaging is limited to the small gap between the electrodes.

Simultaneously Measuring Sample Topography

Using a spring-loaded sample holder such as that shown in FIG. 2, one can also measure sample topography. This is accomplished by measuring the deflection of the sample holder during a scan. Because the probe tip is held fixed, the sample holder will deflect depending on the topography of the sample. For example, if the sample has a bump on top of it, the sample holder will deflect downward. One can record this deflection during a scan, and obtain a topographical image corresponding to the same region as the microwave image(s).

The measurement of the deflection of the sample holder could be accomplished using one of many techniques, including an optical sensor, a capacitive sensor, an interferometer, etc.

Overview

The microwave microscope, as covered in U.S. Pat. No. 5,900,618, consists of a resonator contained in a microwave transmission line. One end of the resonator is an open-ended coaxial probe, which is held close to the sample, and the other end is coupled to a microwave source with a coupling capacitor. A sample is scanned beneath the probe. Because of the concentration of the microwave fields at the probe center conductor, the resonant frequency and quality factor Q of the resonator are perturbed depending on the properties of the sample near the probe center conductor. One quantity recorded while scanning is the resonant frequency shift (Δf) of the resonator.

Two modes of operation are non-contact mode and contact mode. In non-contact mode, the preferred embodiment is with the probe center conductor flush with the face of the probe, so that the end of the center conductor is in the same plane as the end of the outer conductor. A sample is scanned beneath the probe with a small gap of 10–100 μm between the probe and the sample. In contact mode imaging, the center conductor extends beyond the outer conductor, and has a sharp point. The sample holder gently presses the sample against the probe tip with a small force.

The invention involves calibration using dielectric samples with known permittivity. In the case of non-contact mode, the calibration data is interpolated, allowing one to scan dielectric samples with the same thickness as the calibration samples, and to convert the microscope frequency shift into the local permittivity of the sample. In the case of contact-mode imaging, a physical model is used to generate the relationship between the frequency shift of the microscope and the local permittivity of the sample. Because of the use of the model with contact-mode imaging, quantitative imaging in this case is not limited to samples which have the same thickness as the calibration samples. The contact-mode imaging can be used for both bulk and thin-film samples.

In contact mode, a low-frequency electric field can also be applied to the sample, so that permittivity can be measured as a function of the applied electric field. Thus, dielectric nonlinearity can be measured as well as the linear permittivity.

When scanning in contact mode, an optical sensor can be used to measure the deflection of the sample holder, and hence, the sample, as the sample is scanned in contact with the probe tip. The deflection is exactly equal to the topographic changes in the sample. Thus, by recording this reflection at the same time that $\Delta f$ is measured, the sample topography can be imaged simultaneously with the permittivity.

In one embodiment of non-contact mode imaging, the local dielectric constant of a material is determined by measuring the frequency shift of the microscope as a function of height above the sample. Areas as small as 100 μm in diameter can be measured.

An unknown sample is scanned and a dielectric constant is measured as a function of position as long as the height of the probe above the sample is accurately known.

The technique can be performed quickly and at many locations on a bulk dielectric material.

The techniques can be done over a very broad range of frequencies simply by choosing other resonant modes of the microscope. In principle one can measure between about 100 MHz and 50 GHz.

The technique can be applied over a broad range of temperatures, from 1.2K to well above room temperature, possibly as high as 1000° C.

Non-contact Imaging of Dielectric Constant with a Near-Field Scanning Microwave Microscope In another embodiment of the present invention, a non-contact technique for imaging dielectric constant using a resonant near-field scanning microwave microscope is provided. By measuring the shift in the system's resonant frequency during a scan over an insulating sample, one can obtain quantitative images of dielectric variations. In one example, the inventors scanned seven samples with dielectric constants $\in_r$ ranging from 1 to 230, using a 480 μm diameter probe at a height of 100 μm and a frequency of 9.08 GHz. The technique achieves an accuracy of about 25% for $\in_r$=230 and less than 2% for $\in_r$=2.1, limited mainly by variations in the probe-sample separation.

This approach offers a fast, simple, broadband method to image dielectrics using readily available microwave components.

Figure 18:
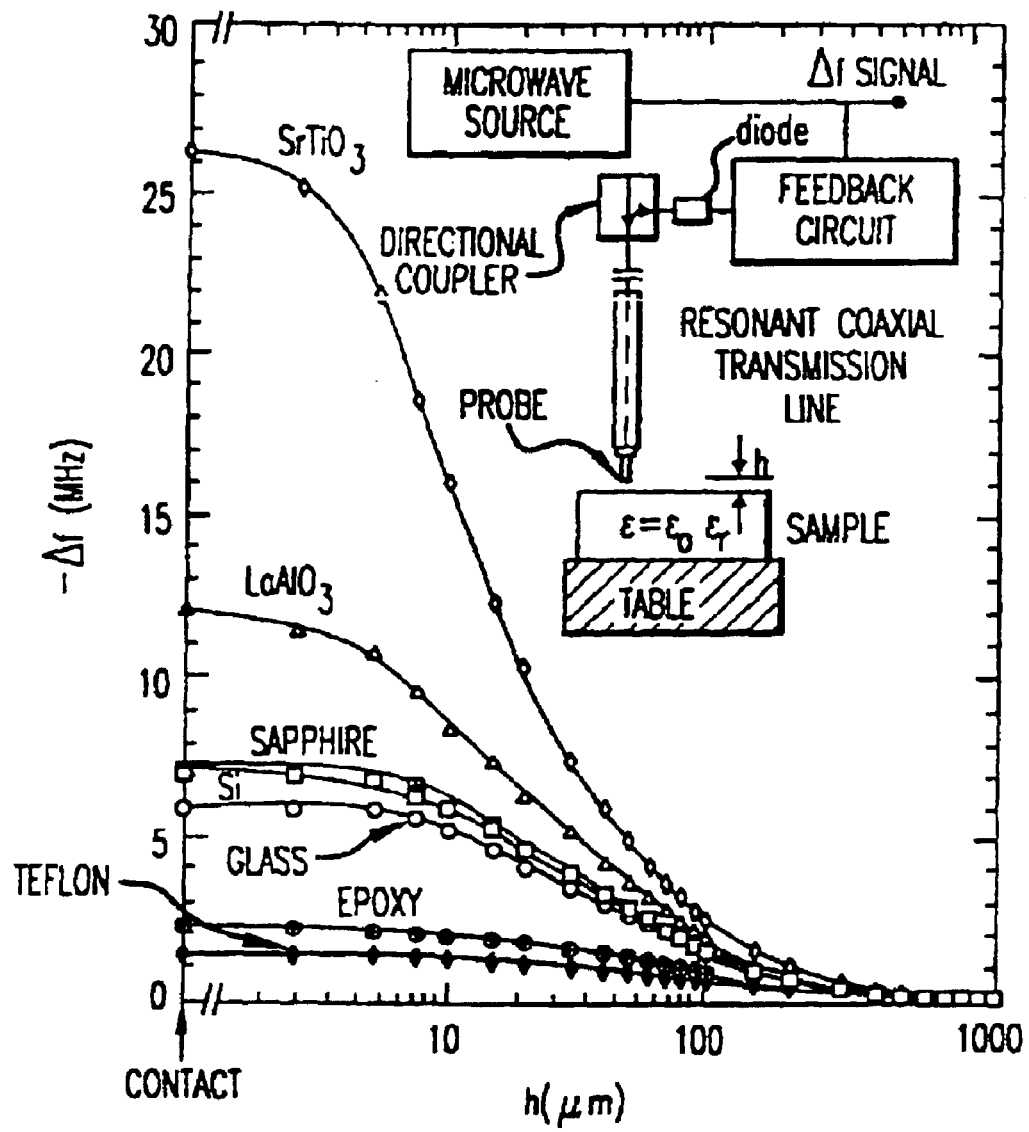
FIG. 18 illustrates frequency shift measurements taken at different heights for several dielectric samples according to an embodiment of the present invention.

In one embodiment, resonant near-field scanning microwave microscope consists of a 1 m long coaxial transmission line which is capacitatively coupled to a microwave source at one end and terminated by an open-ended coaxial probe at the other end. This arrangement creates a resonant circuit in which the resonant frequency $f_0$ and quality factor Q are modified when a sample approaches the open end of the probe (see inset in FIG. 18). By using a frequency-following feedback circuit the invention keeps the microscope source locked on resonance. The shift of the system's resonant frequency $\Delta f$ as the sample under the probe is scanned. The variations in $\Delta f$ are directly related to spatial variations in dielectric constant in the sample. In addition, however, topographic changes will also give rise to changes in $\Delta f$.

Calibration Example

To calibrate the system, the inventors constructed a test sample by placing six pieces of different dielectric material into the bottom of a square plastic mould and pouring epoxy into the mould. In addition, silicone adhesive was used to hold each piece down. After the epoxy cured the test sample was removed from the mould, polished, and positioned on the XY table. The materials embedded in the epoxy were silicon, glass microscope slide, $SrTiO_3$, Teflon, sapphire, and $LaAlO_3$. All six pieces were approximately 500 μm thick and about 6 mm×8 mm in size. The overall thickness of the test sample was 6 mm.

The frequency shift $\Delta f$ versus height h above the six pieces having dielectric constants ranging from 2.1 to about 230 is measured. The inventors also tested the epoxy which has an unknown dielectric constant Each piece, as well as the probe, was flat and smooth on the scale of 5 μm as judged by an optical microscope. For these measurements, a probe with a 480 μm center conductor diameter and a source frequency of 9.08 GHz was used in one example of implementation. For each scan, the probe was first brought in contact with a dielectric sample and the frequency shift $\Delta f$ was recorded as the height was systematically increased. The results are plotted in FIG. 18. Samples with the largest dielectric constant produced the largest frequency shift, as expected. The largest shift observed was −26.2 MHz, when the probe was in contact with a $SrTiO_3$ sample with $\in_r$=230. The smallest shift found was −1.2 MHz when the probe was in contact with a Teflon sample with $\in_r$=2.1. As can be seen from FIG. 18, the frequency shift is essentially zero above 1 mm and saturates when the probe-sample distance is smaller than a few microns.

The inventors used the above information to construct an empirical calibration curve that directly relates the frequency shift to the dielectric constant $\in_r$. In order to construct the calibration curve the inventors took the difference between the frequency shift at two different heights $h_1$ and $h_2$, i.e., $f_d=\Delta f(h_2)-\Delta f(h_1)$, where $h_2$ is far away ($h_2$>1000 μm). By taking the difference, the effect of drift in the microwave source frequency is eliminate As shown in FIG. 19, two calibration curves of $f_d$ versus $\in_r$ can be constructed, one curve for $h_1$=10 μm and $h_2$=1.1 mm and the other for $h_1$=100 μm and $h_2$=1.1 μm. The parameters in each calibration curve are set with an empirical function (solid lines in FIG. 19), allowing us to easily transform any measured frequency shift to a dielectric constant From these curves one can see that one can enhance the sensitivity to the dielectric constant considerably by using a small probe height. On the other hand, at closer probe-sample separations the influence of topographic features will be enhanced.

Imaging Results

To test the dielectric imaging capabilities of our system, the inventors next scanned a single sample of $LaAlO_3$ which had an 8×5 mm triangular shape and a thickness of 510 µm. The inventors placed the sample directory on the metal scanning table and recorded the frequency shift as a function of position. The data was taken at 9.08 GHz using the 480 µm probe at heights of 100 µm and 1.1 mm. The two data sets are subtracted and a 100 µm calibration curve is used to transform the resulting frequency shift image into a dielectric constant image. FIG. 20 shows the resulting contour image of dielectric constant versus 10 Ail position. The dielectric constant varies from about 20 to 25 over the sample and equals 1 when the probe is away from the sample. For comparison, the reported value of relative permittivity for $LaAlO_3$ at room temperature is $\in_r=23.9$ at 18 GHz. In this image, the main variation in $\in r$ over the sample is due to a slight tilt in the sample surface of about 20 µm. The edges of the sample show a smaller value of $\in r$ due to averaging over the inner conductor of the probe. The width of the affected region is in good agreement with the expected spatial resolution of about 500 µm.

Figure 22A:
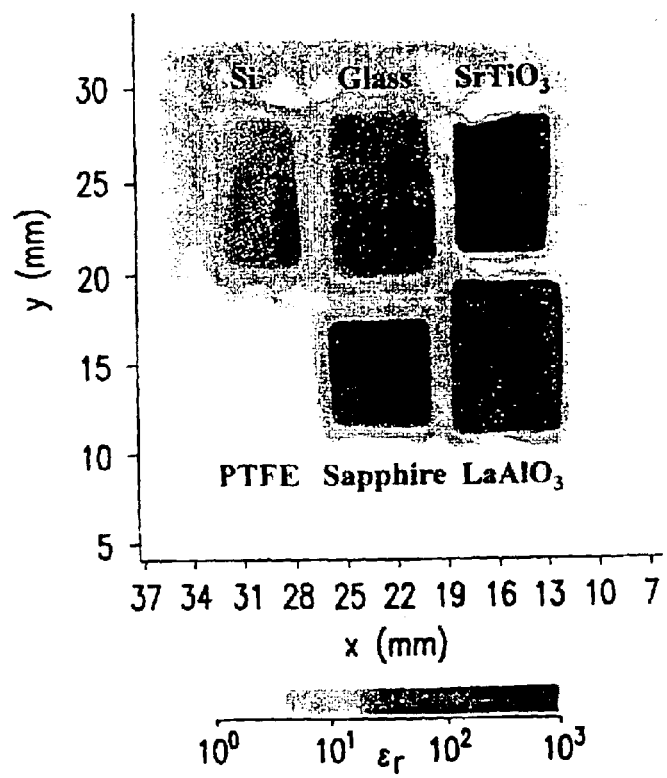
FIG. 22a illustrates a dielectric constant image of a test sample taken with a 480 $\mu$m probe at 9.08 GHz and 100 $\mu$m above the sample according to an embodiment of the present invention.
Figure 22B:
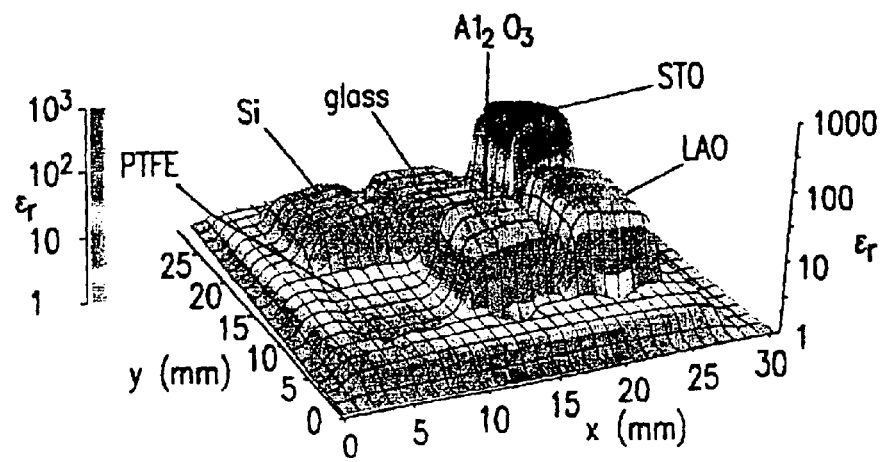
FIG. 22b illustrates the topography of a test sample found according to a method of the present invention.

The inventors next recorded a frequency shift image of the six-piece test sample using a probe-sample separation of 100 µm and the 480 µm diameter probe at 9.08 GHz. As before, using the $\in_r(f_d)$ calibration, the frequency shift image is transformed into a dielectric constant image (see FIG. 22a). The darker regions in FIG. 22a indicate a higher dielectric constant (larger frequency shift) and the lighter regions indicate a smaller dielectric constant (smaller frequency shift). FIG. 22b shows the corresponding surface plot representation. Note that the z-axis in FIG. 22b uses a logarithmic scale to allow us to show the large range of dielectric constants present in the sample. As expected, the largest dielectric constant materials ($SrTiO_3$ and $LaAlO_3$) are the highest surfaces and the smallest dielectric constant materials (Teflon and vacuum) are the lowest. Further, notice that the Teflon sample forms a depression in FIG. 22b, indicating that the dielectric constant of Teflon is lower than the surrounding epoxy. Note that voids in the epoxy can easily be seen as irregularly shaped low-dielectric regions (white regions in FIG. 22a) in the epoxy. FIG. 21 summarizes the dielectric constants for the six test materials and provides comparative data taken from literary sources.

From FIG. 22b, it is apparent that there is some noise in our images of dielectric constant. In our system, the predominant sources of random errors are in noise in our recording electronics and fluctuations in the source frequency. To establish the precision to which $\in r$ can be determined, we determined the standard deviation in $\in_r$ over a small region near the center of the $LaAlO_3$ sample in FIG. 20; we found $\Delta\in_r=0.06$ for a sampling time of 30 ms. Similarly, over the Teflon in FIG. 22a, the standard deviation in $\in_r$ was $7\times10^{-4}$ for a sampling time of 30 ms. From FIG. 22 we can also estimate the absolute accuracy of our technique. For $\in_r=230$ ($SrTiO_3$) the accuracy is about 25% while for $\in_r=2.1$ (Teflon) the accuracy is better than 2%. The main source of these errors is topographic variations. In our test sample, even after polishing, there are small height variations of about 30 µm (e.g. between the sapphire and $SrTiO_3$ in FIG. 22) between the different dielectrics. Such height variations cause an additional frequency shift, resulting in an error in the measured dielectric constant. In this regard, an accurate measurement of the dielectric constant of a single flat dielectric sample is considerably easier. However, the image of the composite sample clearly demonstrates the strength and sensitivity of this non-contact technique to measure variations in $\in_r$.

Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method for contact imaging of dielectric permittivity using a near-field scanning microwave microscope having a resonator with a probe tip comprising the steps of:

(a) calibrating the near-field scanning microwave microscope to determine a geometry descriptor of the probe tip, said step of calibrating the near-field scanning microwave microscope including the step of selecting a resonant frequency of the near-field scanning microwave microscope;

(b) scanning each of at least two calibration samples, wherein for each scan the probe tip is first brought into contact with each of said at least two calibration samples;

(c) generating calibration curves;

(d) scanning a test sample in contact with the probe tip at scanning locations and generating at least one test sample frequency shift value at each scanning location; and (e) determining the dielectric permittivity of the test sample at the sample locations based on the respective generated test sample frequency shift values and the generated calibration curves.

2. The method of claim 1, wherein said calibrating step (a) further includes the steps of:

(i) moving the microscope probe to a predetermined background measurement position;

(ii) measuring a background resonant frequency at said predetermined background measurement position;

(iii) moving the probe tip into contact with said one of said at least two calibration samples at a scanning position;

(iv) measuring a contact resonant frequency at said scanning position;

(v) calculating the difference between said contact resonant frequency and said background resonant frequency;

(vi) storing in memory said calculated difference as a calibration sample resonant frequency shift value;

(vii) moving the sample to the next scanning position;

(viii) determining if said next scanning position is the end of a scan line;

(ix) repeating steps (iv) through (viii) until said end of a scan line has been reached;

(x) moving the sample to the next scan line;

(xi) determining if said next scan line is the end of a scan area;

(xii) repeating steps (i) through (xi) for each of said at least two calibration samples until said end of a scan area has been reached.

3. The method of claim 2, wherein the resonator includes a microscope transmission line, and wherein said step (i)

comprises moving the microscope probe to a height 1.5 times greater than the diameter of the microscope transmission line.

4. The method of claim 2, wherein said step (i) comprises moving the microscope probe to a height where the calibration sample no longer perturbs the resonator.

5. The method of claim 2, wherein said step (i) comprises moving the microscope probe to a height at least approximately 3 millimeters above the calibration sample.

6. The method of claim 1, wherein the geometry descriptor comprises an aspect ratio of the probe tip, and the calibration step (a) further includes calculating the aspect ratio of the microscope probe tip as $\Delta z/\Delta r$, where $\Delta z$ is a distance along a z-direction parallel to a length of the resonator and the probe tip and $\Delta r$ is a radius distance extending from the central axis of the probe tip to its outermost surface.

7. The method of claim 1, wherein the scanning step (d) includes the steps of:
 (i) selecting a resonant frequency of the near-field scanning microwave microscope;
 (ii) placing said test sample on the microscope stage;
 (iii) moving the probe tip into contact with said test sample;
 (iv) storing a position value corresponding to the point of contact with said test sample;
 (v) moving the probe to a predetermined background measurement position;
 (vi) measuring a background resonant frequency at said background measurement position;
 (vii) moving the probe tip into contact with said test sample at the scanning position;
 (viii) measuring the contact resonant frequency at said scanning position;
 (ix) calculating the difference between said contact resonant frequency and said background resonant frequency;
 (x) storing in memory said calculated difference at a test sample resonant frequency shift value;
 (xi) moving the sample to the next scanning position;
 (xii) determining if said next scanning position is the end of a scan line;
 (xiii) repeating steps (viii) through (xii) until said end of a scan line has been reached;
 (xiv) moving the sample to the next scan line;
 (xv) determining if said next scan line is the end of a scan area;
 (xvi) repeating steps (v) through (xv) until said end of a scan area has been reached.

8. The method of claim 7, wherein the resonator includes a microscope transmission line, and wherein said step (v) comprises moving the microscope probe to a height that is at least approximately 1.5 times greater than the diameter of the microscope transmission line.

9. The method of claim 7, wherein step (v) comprises moving the probe to a height where the test sample no longer perturbs the resonator.

10. The method of claim 7, wherein said step (v) comprises moving the probe to a height at least approximately 3 millimeters above the test sample.

11. The method of claim 1, wherein the scanning step (d) includes placing a bulk test sample on the microscope stage.

12. The method of claim 11, wherein the generating a calibration curve step (c) includes the steps of:
 (i) storing electric field configuration data files, wherein the data corresponds to a model sample having approximately the same first thickness and further having approximately the same permittivity as one of said at least two calibration samples with known dielectric properties; and wherein the data stored is representative of electric field values at respective $\in_r$ and $\alpha$ over a predetermined range of $\in_r$ and $\alpha$, where $\in_r$ is a dielectric permittivity value and $\alpha$ is the probe tip geometry descriptor;
 (ii) generating a first model calibration curve using said stored electric field configuration data;
 (iii) generating a second model calibration curve using said stored electric field configuration data;
 (iv) generating a probe calibration curve using said first and second generated model calibration curves and said generated calibration sample frequency shift values; and
 (v) determining the geometry descriptor of the probe tip at the time of scanning of the test sample based upon the positioning of said generated probe calibration curve in relation to said first and second generated model calibration curves.

13. The method of claim 12 wherein the generating a first model calibration curve using said previously stored electric field configuration data (ii) includes the steps of:
 (1) reading from a first electric field configuration data file where $\alpha$=a first probe tip geometry descriptor value, a first previously stored electric field value ($E_1$) and a first permittivity value ($\in_{r1}$);
 (2) reading from a second electric field configuration data file where $\alpha$=a first probe tip geometry descriptor value, a second previously stored electrical field value ($E_2$);
 (3) calculating a point on the first model calibration curve by solving the equation $$\frac{\Delta f}{f} \approx \frac{\epsilon_0}{4W} \int_{V_s} (\epsilon_{r2} - \epsilon_{r1}) \vec{E}_1 \cdot \vec{E}_2 \, dV; \text{ and}$$

(4) repeating steps (1) through (3) until a predetermined number of points on the first model calibration curve have been generated.

14. The method of claim 12 wherein the generating a second model calibration curve using said previously stored electric field configuration data files step (iii) includes the steps of:
 (1) reading from a first previously stored electric field configuration data file where $\alpha$=a second probe tip geometry descriptor value, a first previously stored electric field value ($E_1$) and a first permittivity value ($\in_{r1}$);
 (2) reading from a second previously stored electric field configuration data file where $\alpha$=a second probe tip geometry descriptor value, a second previously stored electric field value ($E_2$) and a second permittivity value ($\in_{r2}$);
 (3) calculating a point on the second model calibration curve by solving the equation $$\frac{\Delta f}{f} \approx \frac{\epsilon_0}{4W} \int_{V_s} (\epsilon_{r2} - \epsilon_{r1}) \vec{E}_1 \cdot \vec{E}_2 \, dV; \text{ and}$$

(4) repeating steps (1) through (3) until a predetermined number of points on the second model calibration curve have been generated.

15. The method of claim 1, wherein the scanning step (d) includes arranging a thin film test sample on top of a dielectric substrate having approximately the same first predetermined thickness and the same permittivity as at least one of said calibration samples and then placing said arrangement on the microscope stage.

16. The method of claim 15, wherein the generating a calibration curve includes the steps of;
  (i) storing electric field configuration data files wherein the data corresponds to a model sample having a thin film of approximately the same second predetermined thickness and a known dielectric permittivity value arranged on top of said dielectric substrate having approximately the same first predetermined thickness and the same permittivity as at least one of said calibration samples with known dielectric properties; wherein the stored data files are representative of electric field values at respective $\in_r$ and $\alpha$ over a predetermined range of $\in_r$ and $\alpha$, wherein $\in_r$ is a dielectric permittivity value for the model sample thin film and $\alpha$ is representative of a probe tip geometry descriptor;
  (ii) generating a first test sample calibration curve using said stored electric field configuration data files;
  (iii) generating a second test sample calibration curve using said stored electric field configuration data files;
  (iv) generating an additional test sample calibration curve using said first and second test sample calibration curves and said generated test sample frequency shift values.

17. The method of claim 16 wherein the generating a first test sample calibration curve using said previously stored electric field configuration data files step (ii) includes the steps of:
  (1) reading from a first electric field configuration data file where $\alpha$=a first probe tip geometry descriptor value, a first previously stored electric field value ($E_1$) and a first permittivity value ($\in_{r1}$) where $\in_{r1}$ is the permittivity of said thin film having approximately the same second determined thickness and known dielectric permittivity;
  (2) reading from a second electric field configuration data file where $\alpha$=a first probe tip geometry descriptor value, a second previously stored electric field value ($E_2$) and a second permittivity value ($\in_{r2}$) where $\in_{r2}$ is the permittivity of said thin film having approximately the same second determined thickness and known dielectric permittivity;
  (3) calculating a point on the first test sample calibration curve by solving the equation $$\frac{\Delta f}{f} \approx \frac{\epsilon_0}{4W}\int_{Vs}(\epsilon_{r2} - \epsilon_{r1})\vec{E}_1 \cdot \vec{E}_2\, dV; \text{ and}$$

(4) repeating steps (1) through (3) until a predetermined number of points on the first test sample calibration curve have been generated.

18. The method of claim 16 wherein the generating a second test sample calibration curve using said previously stored electric field configuration data files step (iii) includes the steps of:
  (1) reading from a first previously stored electric field configuration data file where $\alpha$=a second probe tip geometry descriptor value, a first previously stored electric field value ($E_1$) and a first permittivity value ($\in_{r1}$) where $\in_{r1}$ is the permittivity of said thin film having approximately the same second determined thickness and known dielectric permittivity;
  (2) reading from a second previously stored electric field configuration data file where $\alpha$=a second probe tip geometry descriptor value, a second previously stored electric field value ($E_2$) and a second permittivity value ($\in_{r2}$) where $\in_{r2}$ is the permittivity of said thin film having approximately the same second determined thickness and known dielectric permittivity;
  (3) calculating a point on the second test sample calibration curve by solving the equation $$\frac{\Delta f}{f} \approx \frac{\epsilon_0}{4W}\int_{Vs}(\epsilon_{r2} - \epsilon_{r1})\vec{E}_1 \cdot \vec{E}_2\, dV; \text{ and}$$

(4) repeating steps (1) through (3) until a predetermined number of points on the second test sample calibration curve have been generated.

19. An apparatus for displaying dielectric properties comprising:
  (a) a near-field scanning microwave microscope having an open-ended coaxial probe with a sharp, protruding center conductor;
  (b) a coaxial transmission line resonator that has a resonant frequency;
  (c) a microwave source coupled to said coaxial transmission line resonator through a capacitive coupler for generating said voltage;
  (d) a spring-loaded cantilever for supporting said sample in contact with said sharp protruding center conductor;
  (e) a bias tee coupled to said coaxial transmission line resonator for applying a local electric field to said sample in contact with said sharp protruding center conductor;
  (f) a first motor controller for manipulating said sample in contact with said sharp protruding center conductor in a first direction;
  (g) a second motor controller for manipulating said sample in contact with said sharp protruding center conductor in a second direction;
  (h) a third motor controller for manipulating said sample in contact with said sharp protruding center conductor in a third direction;
  (i) a coupler joined to said microwave source and said coaxial transmission line resonator;
  (j) a detector for converting the microwave signal from said coupler into an input signal;
  (k) a feedback circuit receives the output signal from said detector and measures a shift change in resonance frequency, wherein said feedback circuit keeps said microwave source locked onto a predetermined resonant frequency;
  (l) a processor for determining between at least one parameter related to a change in said resonant frequency and a known dielectric property value of a sample responsible for said change; wherein the processor is further able to receive from said feedback circuit said value for at least one parameter related to a change in said resonant frequency due to an unknown dielectric property of said sample and determine the value of said unknown dielectric property; and
  (m) a display device for imaging the value of said unknown dielectric property once said value is determined by said processor.

20. A method for non-contact imaging of dielectric permittivity using a near-field scanning microwave microscope having a resonator with a probe tip comprising the steps of:
   (a) calibrating the near-field scanning microwave microscope using at least three dielectric samples with known dielectric properties, said step of calibrating the near-field scanning microwave microscope further including the selection of a resonant frequency of the near-field scanning microwave microscope;
   (b) generating calibration curves;
   (c) scanning a test sample with the probe at a predetermined scanning height and generating at least one test sample frequency shift value at said predetermined scanning height; and
   (d) determining the dielectric permittivity of the test sample based on the generated test sample resonant frequency shift value and the generated calibration curves.

21. The method of claim 20, wherein said calibrating step (a) further includes the steps of:
   (i) placing one of said at least three calibration samples beneath the probe;
   (ii) positioning the probe at a first predetermined height;
   (iii) measuring a resonant frequency at said first predetermined height;
   (iv) moving the probe to a second predetermined height;
   (v) measuring the resonant frequency at said second predetermined height;
   (vi) calculating the difference between said resonant frequency at said first predetermined height and said resonant frequency at said second predetermined height;
   (vii) storing in memory said calculated difference as a calibration sample resonant frequency shift value;
   (viii) repeating steps (i) through (vii) for each of said at least two calibration samples.

22. The method of claim 20, wherein said generating calibration curves step (b) includes the step of plotting said calibration frequency shift values as a function of dielectric constant ($\epsilon_r$) and frequency shift.

23. The method of claim 20, wherein said scanning a test sample step (c) includes the steps of:
   (i) selecting a resonant frequency of the near-field scanning microwave microscope;
   (ii) placing said test sample beneath the probe;
   (iii) positioning the probe at a first predetermined height;
   (iv) measuring a resonant frequency at said first predetermined height;
   (v) moving the probe to a second predetermined height;
   (vi) measuring the resonant frequency at said second predetermined height;
   (vii) calculating the difference between said resonant frequency at said first predetermined height and said resonant frequency at said second predetermined height;
   (viii) storing in memory said calculated difference as a test sample resonant frequency shift value.

* * * * *